(12) United States Patent
Kandori et al.

(10) Patent No.: US 11,025,199 B2
(45) Date of Patent: Jun. 1, 2021

(54) OSCILLATOR AND IMAGING DEVICE

(71) Applicant: CANON KABUSHIKI KAISHA, Tokyo (JP)

(72) Inventors: Atsushi Kandori, Ebina (JP); Noriyuki Kaifu, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/795,987

(22) Filed: Feb. 20, 2020

(65) Prior Publication Data

US 2020/0266762 A1 Aug. 20, 2020

(30) Foreign Application Priority Data

Feb. 20, 2019 (JP) .............................. JP2019-028242

(51) Int. Cl.
*H03B 7/08* (2006.01)
*H03B 5/12* (2006.01)
*H03B 7/14* (2006.01)

(52) U.S. Cl.
CPC ............... *H03B 7/08* (2013.01); *H03B 5/129* (2013.01); *H03B 7/14* (2013.01)

(58) Field of Classification Search
CPC ........................................................ H03B 7/08
USPC ....................................................... 331/107 T
See application file for complete search history.

(56) References Cited

U.S. PATENT DOCUMENTS

| | | | |
|---|---|---|---|
| 5,825,032 A | 10/1998 | Nonaka et al. | |
| 6,333,963 B1 | 12/2001 | Kaifu et al. | |
| 6,528,796 B1 | 3/2003 | Kaifu et al. | |
| 2002/0024601 A1 | 2/2002 | Kaifu et al. | |
| 2002/0025022 A1 | 2/2002 | Kaifu et al. | |
| 2002/0159563 A1 | 10/2002 | Tashiro et al. | |
| 2003/0086523 A1 | 5/2003 | Tashiro et al. | |
| 2004/0086079 A1 | 5/2004 | Tashiro et al. | |
| 2005/0259170 A1 | 11/2005 | Kaifu et al. | |
| 2006/0008284 A1 | 1/2006 | Ushijima et al. | |
| 2006/0267578 A1 | 11/2006 | Ushijima et al. | |
| 2008/0218172 A1 | 9/2008 | Ushijima et al. | |
| 2008/0264167 A1 | 10/2008 | Kandori et al. | |
| 2009/0193893 A1 | 8/2009 | Kandori et al. | |
| 2009/0205423 A1 | 8/2009 | Takagi et al. | |
| 2010/0213791 A1 | 8/2010 | Kandori et al. | |
| 2011/0031568 A1 | 2/2011 | Kandori et al. | |
| 2011/0169510 A1 | 7/2011 | Kandori et al. | |
| 2012/0001698 A1 | 1/2012 | Koyama et al. | |
| 2012/0103096 A1 | 5/2012 | Kandori | |

(Continued)

FOREIGN PATENT DOCUMENTS

| | | | |
|---|---|---|---|
| JP | 5612842 B2 | 10/2014 | |
| JP | 5717336 B2 | 5/2015 | |

OTHER PUBLICATIONS

Co-pending U.S. Appl. No. 16/815,153, filed Mar. 11, 2020.

(Continued)

*Primary Examiner* — Joseph Chang
(74) *Attorney, Agent, or Firm* — Venable LLP

(57) ABSTRACT

An oscillator comprising: a resonator including a negative resistance element; a voltage bias circuit configured to apply a voltage across the negative resistance element; and a first shunt element in which a resistor and a capacitor are electrically connected in series, wherein the negative resistance element and the first shunt element are electrically connected in parallel to the voltage bias circuit.

20 Claims, 15 Drawing Sheets

(56) References Cited

U.S. PATENT DOCUMENTS

| | | |
|---|---|---|
| 2012/0105161 A1 | 5/2012 | Ouchi et al. |
| 2012/0119838 A1* | 5/2012 | Koyama .................. H03B 7/08 331/115 |
| 2012/0194107 A1 | 8/2012 | Kandori et al. |
| 2012/0218867 A1 | 8/2012 | Kandori et al. |
| 2013/0064035 A1 | 3/2013 | Kandori |
| 2013/0328635 A1 | 12/2013 | Sekiguchi |
| 2014/0285219 A1 | 9/2014 | Kandori et al. |
| 2014/0301167 A1 | 10/2014 | Kandori |
| 2014/0360272 A1 | 12/2014 | Kandori |
| 2015/0009778 A1 | 1/2015 | Kandori et al. |
| 2016/0087551 A1 | 3/2016 | Kandori et al. |
| 2016/0302767 A1 | 10/2016 | Gemma et al. |
| 2017/0155361 A1 | 6/2017 | Suzuki et al. |
| 2018/0254716 A1 | 9/2018 | Kandori |
| 2019/0067788 A1 | 2/2019 | Koyama |

OTHER PUBLICATIONS

Co-pending U.S. Appl. No. 16/815,171, filed Mar. 11, 2020.
Co-pending U.S. Appl. No. 16/815,190, filed Mar. 11, 2020.
Jul. 10, 2020 Extended Search Report for European Patent Application No. 20158189.9.

* cited by examiner

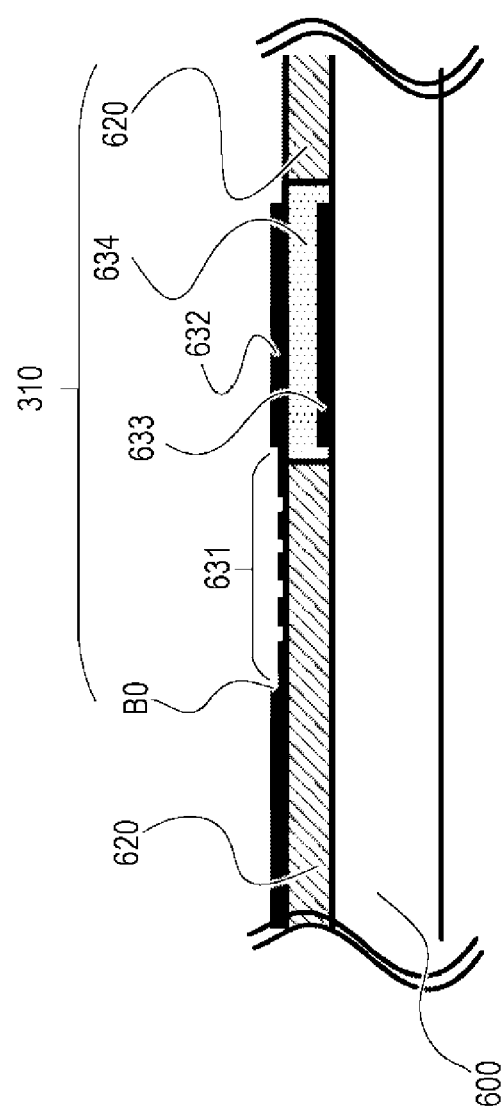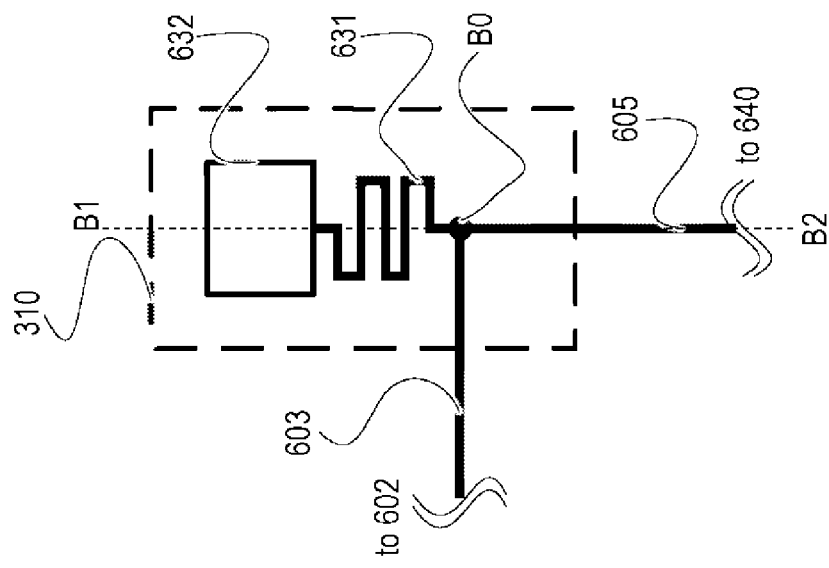
FIG.6B
FIG.6A

OSCILLATOR AND IMAGING DEVICE

BACKGROUND OF THE INVENTION

Field of the Invention

The present technology relates to an oscillator and an imaging device.

Description of the Related Art

An oscillation circuit (resonator) including a negative resistance element such as a resonant tunnel diode (RTD) may be used as a small oscillator that generates a terahertz wave, which is a predetermined electromagnetic wave in a frequency band of 30 GHz to 30 THz. This oscillation circuit is connected to a voltage bias circuit that, for example, applies to the negative resistance element a voltage value to enable the negative resistance element to have negative resistance characteristics. It is to be noted that the negative resistance element has a gain in a wide frequency band as well as a predetermined electromagnetic wave frequency (predetermined frequency). For this reason, connecting the negative resistance element and the voltage bias circuit causes an oscillation of an electromagnetic wave at a resonance point lower than the predetermined frequency (hereinafter referred to as the "parasitic oscillation"), which should be suppressed.

In this regard, Japanese Patent No. 5717336 and Japanese Patent No. 5612842 disclose an oscillator including an oscillation circuit 100 with a negative resistance element 101 and also including a voltage bias circuit 200. As illustrated in FIG. 15A, Japanese Patent No. 5717336 discloses a configuration in which a resistive element 301 (shunt resistance element; resistor) is arranged in parallel with the negative resistance element 101 to suppress parasitic oscillation. On the other hand, as illustrated in FIG. 15B, Japanese Patent No. 5612842 discloses a configuration in which a capacitive element 302 (shunt capacitance element; capacitor) is arranged in parallel with the negative resistance element 101 to suppress parasitic oscillation.

SUMMARY OF THE INVENTION

However, the oscillator according to Japanese Patent No. 5612842 includes the resistive element 301, so the voltage bias circuit 200 needs to constantly pass a direct current. This causes a problem that the oscillator needs to continue to consume power in order to stabilize the oscillation of a predetermined electromagnetic wave. On the other hand, the oscillator according to Japanese Patent No. 5612842 requires just an instantaneous current but no direct current to flow through the voltage bias circuit 200. This makes it possible to reduce power consumption as compared with the oscillator according to Japanese Patent No. 5612842. However, there is still a problem in stability of suppression of parasitic oscillation due to the capacitive element 302.

Therefore, an object of the present technology is to provide an oscillator capable of providing stable suppression of parasitic oscillation while preventing an increase in power consumption.

An aspect of the technology of the present disclosure is:
an oscillator comprising:
a resonator including a negative resistance element;
a voltage bias circuit configured to apply a voltage across the negative resistance element; and
a first shunt element in which a resistor and a capacitor are electrically connected in series, wherein
the negative resistance element and the first shunt element are electrically connected in parallel to the voltage bias circuit.

According to the present technology, it is possible to provide stable suppression of parasitic oscillation in the oscillator while preventing an increase in power consumption.

Further features of the present invention will become apparent from the following description of exemplary embodiments with reference to the attached drawings.

BRIEF DESCRIPTION OF THE DRAWINGS

FIGS. 6A and 6B are diagrams each illustrating an external configuration of a shunt element according to the first embodiment;

DESCRIPTION OF THE EMBODIMENTS

Hereinafter, embodiments of the disclosure of the present technology will be described with reference to the drawings. However, the disclosure of the present technology is not limited to the embodiments, and various modifications and changes are possible within the scope and spirit of the technology.

First Embodiment

An oscillator according to the present embodiment includes a voltage bias circuit that applies a voltage to a negative resistance element. The negative resistance element and a shunt element in which a resistor and a capacitor are arranged in series are electrically connected in parallel to the voltage bias circuit. This realizes an oscillator that is capable of providing stable suppression of parasitic oscillation while preventing an increase in power consumption.

Circuit Configuration of Oscillator

Figure 1A:
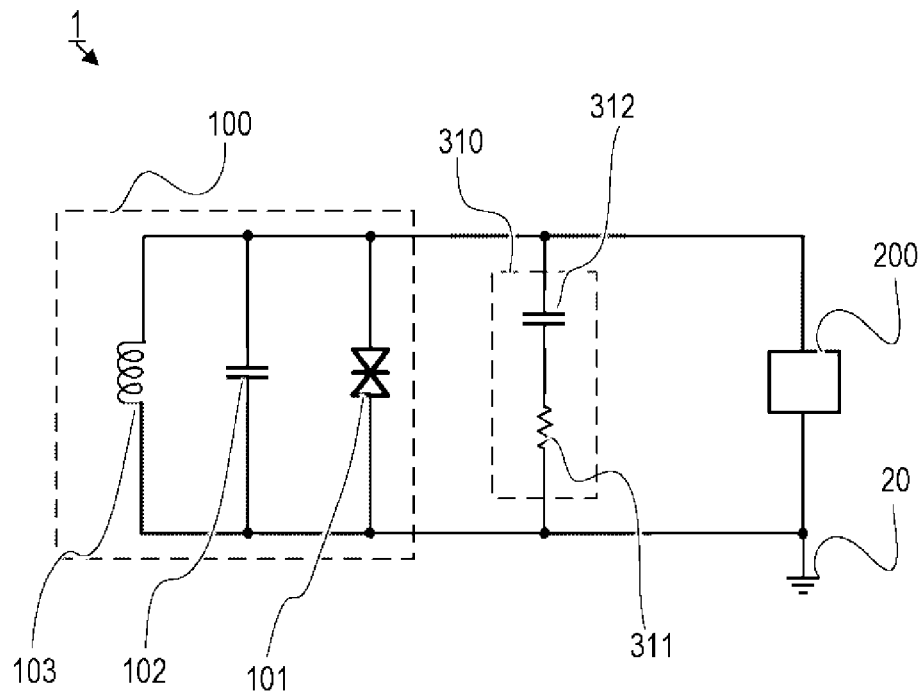
FIGS. 1A and 1B are each a circuit configuration diagram of an oscillator according to a first embodiment.
Figure 1B:
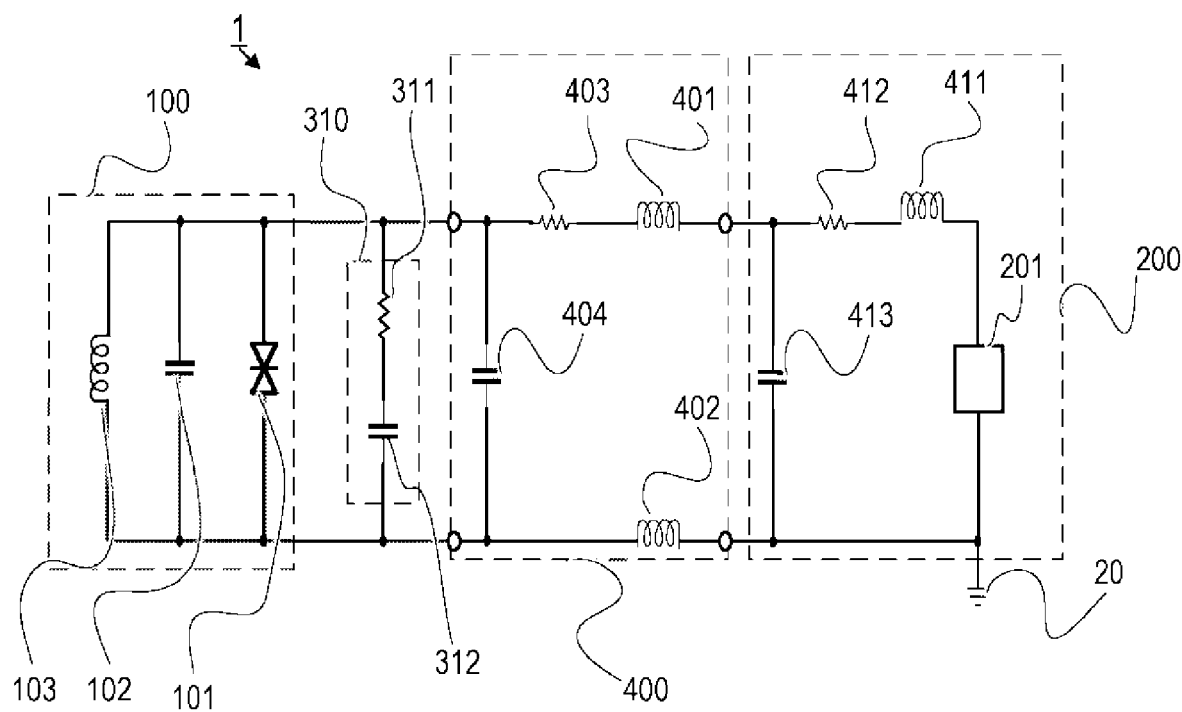

A circuit configuration of an oscillator 1 according to the present embodiment will be described with reference to FIGS. 1A and 1B. FIG. 1A illustrates a simple circuit configuration (minimum circuit configuration) of the oscillator 1, and FIG. 1B illustrates a more detailed circuit configuration of the oscillator 1. The oscillator 1 includes an oscillation circuit 100, a voltage bias circuit 200, and a shunt element 310.

The oscillation circuit 100 is a resonator (terahertz oscillation circuit) including elements such as a negative resistance element 101, a capacitor 102, and an inductor 103. More specifically, the negative resistance element 101, and the capacitor 102 and the inductor 103 which are connected in parallel to the negative resistance element 101 constitute the oscillation circuit 100. The oscillation circuit 100 causes the voltage bias circuit 200 to apply a predetermined voltage to the negative resistance element 101 to produce an oscillation of electromagnetic wave with a predetermined frequency of 30 GHz to 30 THz (a terahertz wave; a predetermined electromagnetic wave). That is, the predetermined electromagnetic wave is an electromagnetic wave that is mainly determined based on design parameters of the oscillation circuit 100 to cause the oscillation circuit 100 to oscillate (resonate). It is to be noted that the oscillation of the predetermined electromagnetic wave (terahertz wave) by the oscillation circuit 100 is hereinafter referred to as the "terahertz oscillation".

As the negative resistance element 101, a voltage-controlled negative resistor may be used. Specifically, using a current-injection resonant tunnelling diode (RTD) makes it possible to configure the oscillation circuit 100 with an electromagnetic wave of a predetermined frequency (terahertz frequency). This resonant tunnelling diode is composed of a GaAS and InP substrate and a quantum well made of GaAs/AlGaAs and InGaAs/InAlAs epitaxially grown in a lattice matching system on the GaAS and InP substrate.

Figure 2:
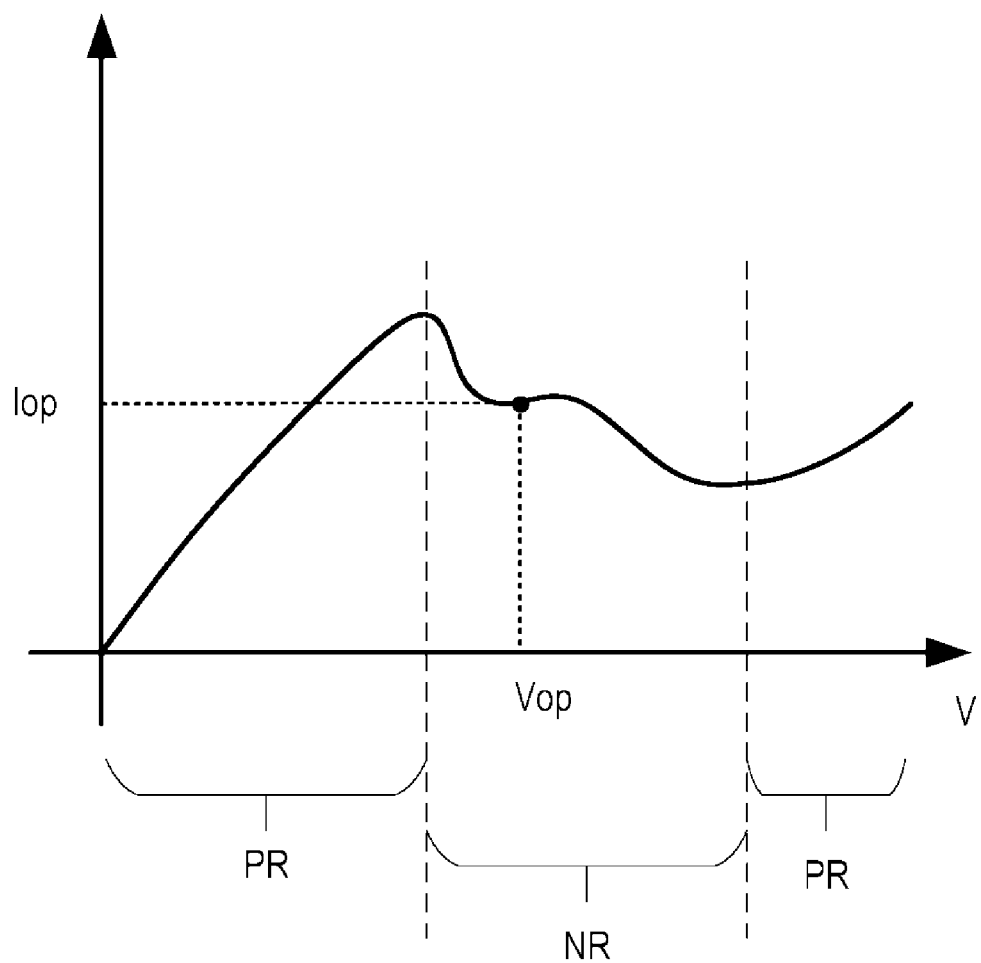
FIG. 2 is a diagram for explaining voltage-current characteristics in a negative resistance element.

FIG. 2 illustrates voltage-current characteristics of the negative resistance element (RTD) 101 when a voltage V is applied across both terminals (anode and cathode) of the negative resistance element 101 and accordingly, a current I flows through the negative resistance element 101. This voltage-current characteristic can be divided into two regions: a region PR in which the current value increases with increasing voltage and a region NR in which the current value decreases with increasing voltage. The region NR in which the current value decreases according to the increased voltage is a region having negative resistance characteristics, and is hereinafter referred to as the "negative resistance region". Here, when a voltage value Vop within the negative resistance region is applied across both terminals of the negative resistance element 101, an electromagnetic wave (terahertz wave) oscillates with a terahertz frequency ft through the negative resistance element 101, the capacitor 102, and the inductor 103. It is to be noted that the voltage value Vop to be applied is preferably set to a value of or around the center of the voltage range of the negative resistance region NR in order to enhance the stability of oscillation. However, the voltage is not limited to this, and any other voltage may be applied as long as it is within the negative resistance region.

The current value flowing through the negative resistance element 101 when the voltage value Vop is applied is referred to as Iop. It is to be noted that a specific value of the voltage value Vop varies depending on the parameters of the negative resistance element 101, and is generally in a range of about 0.5 to 1.5 V (voltages) (at least 0.5 V and not more than 1.5 V) in many cases. On the other hand, a specific value of the current value Top varies depending on the parameters of the negative resistance element 101, and is generally in a range of about 20 to 150 mA (milliamperes) (at least 20 mA and not more than 150 mA) in many cases. However, the value ranges are not limited to such voltage value range and current value range, and any range out of such a range may be applied so that the same advantageous effect can be obtained.

The voltage bias circuit 200 is a circuit for applying the voltage value Vop (DC voltage) in the negative resistance region to the negative resistance element (RTD) 101. The voltage bias circuit 200 includes, for example, an ideal voltage source 201, a parasitic inductor 411, a parasitic resistor 412, a parasitic capacitor 413, and the like as illustrated in FIG. 1B. Further, the voltage bias circuit 200 itself is not an ideal voltage source because it includes parasitic elements such as the parasitic inductor 411, the parasitic resistor 412, and the parasitic capacitor 413. Therefore, electromagnetic wave oscillation (parasitic oscillation) at a frequency other than the terahertz frequency ft may occur across the elements included in the oscillation circuit 100 and the parasitic elements included in the voltage bias circuit 200.

Although omitted in FIG. 1A, as illustrated in FIG. 1B, a wiring section 400 is located between the oscillation circuit 100 and the voltage bias circuit 200 in many cases in order to implement various functions of the oscillator 1.

The wiring section 400 is arranged between the oscillation circuit 100 and the voltage bias circuit 200, and includes, for example, four parasitic elements: a parasitic inductor 401, a parasitic inductor 402, a parasitic resistor 403, and a parasitic capacitor 404. Accordingly, parasitic oscillation may occur across the elements included in the oscillation circuit 100 and the parasitic elements included in the wiring section 400 at a frequency different from the terahertz frequency ft.

The shunt element 310 prevents parasitic oscillation caused by the elements included in the oscillation circuit 100 described above and other parasitic elements. The shunt element 310 is composed of a resistive element 311 (shunt resistance element) and a capacitive element 312 (shunt capacitance element), which are arranged in series. It is to be noted that in the present embodiment, the "shunt element" has one terminal connected to a common wire (substrate; ground 20) and the other terminal connected to a wire between the oscillation circuit 100 and the voltage bias circuit 200.

Loss Characteristics of Electromagnetic Wave

Figure 3A:
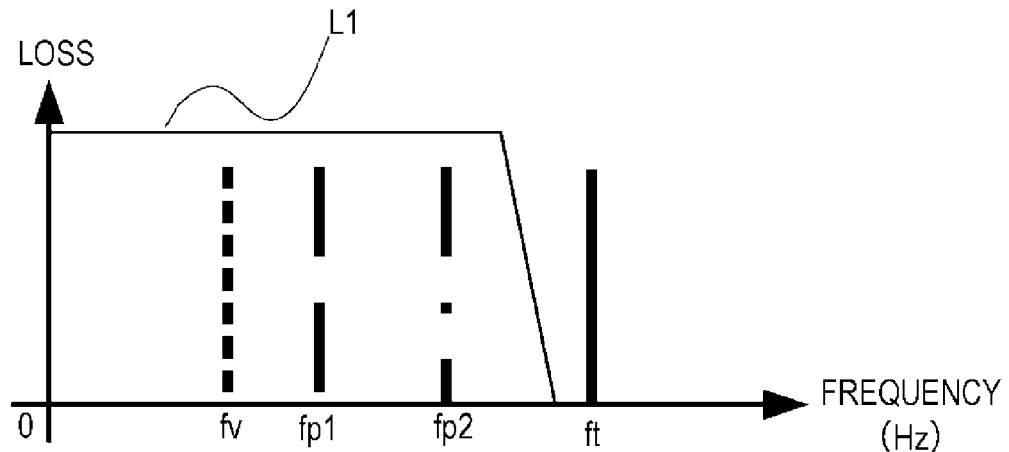
FIGS. 3A and 3B each illustrate a loss of electromagnetic waves according to a comparative example.
Figure 3B:
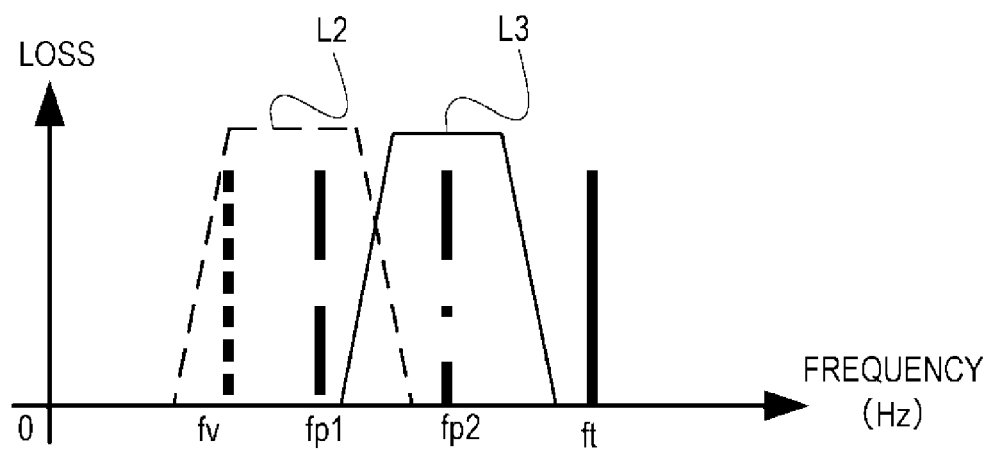
Figure 3C:
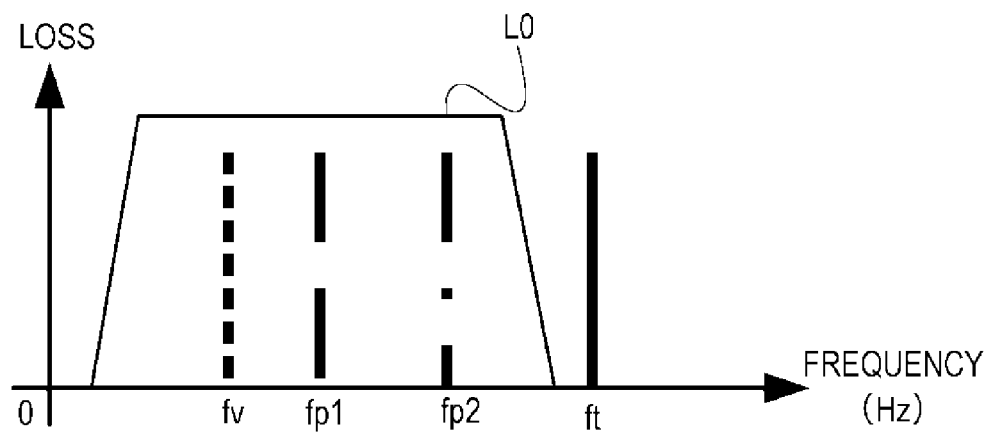
FIG. 3C illustrates a loss of electromagnetic waves according to the first embodiment.

Next, the effect of the shunt element 310 of the present embodiment suppressing the parasitic oscillation will be described with reference to FIGS. 3A to 3C. FIGS. 3A and 3B illustrate loss characteristics (cut-off characteristics) of electromagnetic wave in a shunt element included in an oscillator of a comparative example. FIG. 3C illustrates loss characteristics of electromagnetic wave in the shunt element 310 of the oscillator 1 according to the present embodiment.

Here, FIGS. 3A to 3C are schematic diagrams illustrating the loss characteristics of the electromagnetic wave for each frequency in the shunt element. In the graphs illustrated in FIGS. 3A to 3C, the horizontal axis indicates the frequency, and the vertical axis indicates an example of the magnitude of electromagnetic wave loss in the shunt element. Here, as the loss (loss amount) increases, it is possible to suppress the oscillation of the electromagnetic wave. It is to be noted that the frequency at a boundary of the range where the shunt element has a loss is hereinafter referred to as the "cut-off frequency". Specifically, the shunt element can suppress the oscillation of electromagnetic waves in a frequency band between the cut-off frequency on the higher frequency side and the cut-off frequency on the lower frequency side.

In FIGS. 3A to 3C, ft is a terahertz frequency (at least 30 GHz and not more than 30 THz), and fp1, fp2, and fv are each a parasitic oscillation frequency. The parasitic oscillation frequencies fp1 and fp2 are oscillation frequencies of electromagnetic waves produced by the oscillation circuit 100 and the parasitic elements of the wiring section 400. The parasitic oscillation frequency fv is an oscillation frequency of an electromagnetic wave produced by the oscillation circuit 100 and the parasitic elements in the voltage bias circuit 200.

Use of Resistive Element as Shunt Element

First, FIG. 3A illustrates an example of loss characteristics in the case where a "resistive element (resistor)" is used as the shunt element. In this case, the shunt element has a loss L1 at all frequencies slightly lower than the terahertz frequency ft, and thus makes it possible to suppress the parasitic oscillation at the parasitic oscillation frequencies fp1, fp2, and fv. That is, in the present example, the oscillator has a loss in a wide frequency band, and thus makes it possible to sufficiently suppress the parasitic oscillation. On the other hand, the oscillator of the present example allows a current to flow through the resistive element constantly, which may cause unnecessary power consumption.

Use of Capacitive Element as Shunt Element

FIG. 3B illustrates an example of loss characteristics in the case where "capacitive elements (capacitors)" are used as the shunt element. FIG. 3B also illustrates an example of a configuration of the oscillator including two capacitive elements. More specifically, the oscillator includes a capacitive element having a predetermined capacitance value (a capacitive element having a small capacitance value) and a capacitive element having a larger capacitance value.

The capacitive element having a small capacitance value has a loss L3 around fp2, which is a frequency lower than the terahertz frequency ft, and suppresses the parasitic oscillation at the parasitic oscillation frequency fp2. However, any loss at a lower frequency cannot be generated only by the capacitive element. For this reason, the oscillator further includes the capacitive element having a large capacitance value. The capacitive element having a large capacitance value has a loss L2 around the parasitic oscillation frequencies fp1 and fv, which are lower than the parasitic oscillation frequency fp2, and suppresses the parasitic oscillation at the parasitic oscillation frequencies fp1 and fv.

However, in the present example, when the parasitic oscillation frequency fv is a low frequency, or when a parasitic oscillation frequency component lower than fv is included, it is difficult to generate a loss by the capacitive element in a low frequency range, making it difficult to suppress the parasitic oscillation. This is because it is easy to reduce the impedance of the capacitive element in a high frequency range, but it is difficult to reduce the impedance of the capacitive element in a low frequency range. Further, resonance may occur in the capacitive element used as the shunt element and the parasitic inductor 402 included in the wiring section 400, which even causes the capacitive element to generate parasitic oscillation.

Use of Resistive Element and Capacitive Element as Shunt Element in Present Embodiment FIG. 3C illustrates an example of loss characteristics when an element in which the resistive element 311 (resistor) and the capacitive element 312 (capacitance) are connected in series is used as the shunt element 310, as in the present embodiment. As illustrated in FIG. 3C, at a high frequency, the resistive element 311 has a loss L0. In other words, the resistive element 311 acts as a shunt element that suppresses the parasitic oscillation. In this manner, unnecessary energy generated in the oscillation circuit 100 is appropriately lost by the resistive element 311. Thereby making it possible to prevent the parasitic elements of the wiring section 400 or the voltage bias circuit 200 and the oscillation circuit 100 from being coupled, and thus to suppress the parasitic oscillation.

On the other hand, the impedance of the capacitive element 312 is large at not more than the cut-off frequency on the low frequency side of the shunt element 310. Accordingly, there is no loss generated by the shunt element 310 at the low frequency. In other words, the shunt element 310 is in an open state around the direct current and no loss is also generated by the resistive element 311, so that the power consumption of the entire oscillator 1 can be suppressed. Accordingly, the cut-off frequency on the low frequency side is set to be lower than the lowest parasitic oscillation frequency fv in the oscillation circuit 100, thereby making it possible to suppress the power consumption of the oscillator 1. It is to be noted that the cut-off frequency on the low frequency side is a frequency determined by the time constant of the capacitive element 312 and the resistive element 311, and can be adjusted to a very low frequency by adjusting their respective resistance value and capacitance value.

It is to be noted that in the present embodiment, even if there is resonance between the parasitic inductor 401 or the parasitic inductor 411 and the capacitive element 312 in the shunt element 310, the loss of the resistive element 311 in the shunt element 310 makes it possible to suppress the parasitic oscillation.

As described above, the shunt element 310 according to the present embodiment includes the resistive element 311 (resistor) that suppresses the parasitic oscillation and the capacitive element 312 (capacitor) that suppresses the power consumption around a direct current. This makes it possible to suppress both the parasitic oscillation and unnecessary power.

It is to be noted that it is preferable to select, for the resistive element 311, a resistance value close to an absolute value |Zrtd| of the impedance of the negative resistance element 101 in the negative resistance region, in order to stabilize the oscillation of terahertz waves. Specifically, a value of half to two times (at least ½ and not more than 2 times) of |Zrtd| is preferably selected as the resistance value. More preferably, the resistance value is 0.8 to 1.2 times (at least 0.8 and not more than 1.2 times) of |Zrtd|.

Selecting the resistance value in this way makes it possible to suppress the parasitic oscillation due to the parasitic elements more effectively and to stabilize the terahertz oscillation in the oscillation circuit 100. It is to be noted that the absolute value |Zrtd| of impedance in the negative resistance region of the resistive element 311 is typically in a range of several ohms to several tens of ohms. Further, depending on the oscillation frequency of the oscillator 1, the absolute value |Zrtd| may be as large as about hundred ohms.

On the other hand, the capacitance value of the capacitive element 312 is preferably set to a value such that the cut-off frequency f0 on the low frequency side (frequency determined by the time constant of the resistive element 311 and the capacitive element 312) is not more than a lower limit frequency for suppressing the parasitic oscillation. Specifically, the capacitance value C of the capacitive element 312 is set such that the impedance $1/(2\pi f0 \times C)$ of the capacitive element 312 at the frequency f0 is sufficiently lower than the resistance value R of the resistive element 311. The capacitance value C is set such that the impedance $1/(2\pi f0 \times C)$ preferably has at least the value of a fraction, more preferably at least the value of 1/10, of the resistance value R. In other words, it is desirable to satisfy $R/10 \geq 1/(2\pi f0 \times C)$. For example, if the resistance value R is 10Ω and the frequency f0 is 1 MHz, the capacitance value C of the capacitive element 312 is preferably at least 160 pF.

It is to be noted that it is desirable that the capacitance value C is as large as possible unless there is any problem with mounting size restrictions and the switching speed in an AC bias circuit used in a sixth embodiment described later. The values of the resistive element 311 and the capacitive element 312 are preferably set to optimum values based on the relationship between the parameters of the oscillation circuit and the parasitic oscillation frequency to be suppressed.

In addition, it is necessary to carefully determine the position where the shunt element 310 is disposed. Specifically, it is necessary to set the length of a wire connecting the negative resistance element 101 and the shunt element 310 to not more than ¼ of a wavelength λ of an electromagnetic wave having the maximum parasitic oscillation frequency the parasitic oscillation of which is to be suppressed by the shunt element 310 (which has a loss). In the example illustrated in FIG. 3C, the length of the wire needs to be ¼ of the wavelength of the electromagnetic wave having the parasitic oscillation frequency fp2. This is because, if the wavelength of an AC signal is short, its phase changes greatly only by slightly changing the position of the wire, and an equivalent capacitor or an equivalent inductor is generated due to reflection at the end of the wire. In particular, in order to suppress parasitic oscillation from gigahertz, which is a shorter wavelength, to terahertz, it is necessary to dispose the shunt element 310 closer to the negative resistance element 101. As described above, if the length of the wire connecting the negative resistance element 101 and the shunt element 310 is not more than ¼ of the wavelength λ it is possible to prevent an equivalent capacitor or an equivalent inductor due to reflection at the end of the wire from being generated, and to suppress parasitic oscillation. It is to be noted that the wavelength of the electromagnetic wave having the maximum parasitic oscillation frequency the parasitic oscillation of which is to be suppressed by the shunt element 310 may be referred to as a wavelength corresponding to the cut-off frequency on the high frequency side of the shunt element 310.

It is to be noted that the length of the wire connecting the negative resistance element 101 and the shunt element 310 may be set to not more than ¼ of a wavelength λm of the predetermined electromagnetic wave (terahertz wave). This setting makes it possible to prevent an equivalent capacitor or an equivalent inductor due to reflection at the end of the wire from being generated at all the parasitic oscillation frequencies lower than the terahertz frequency ft of the predetermined electromagnetic wave, resulting in more effective suppression of the parasitic oscillation.

External Configuration of Oscillator

Figure 4A:
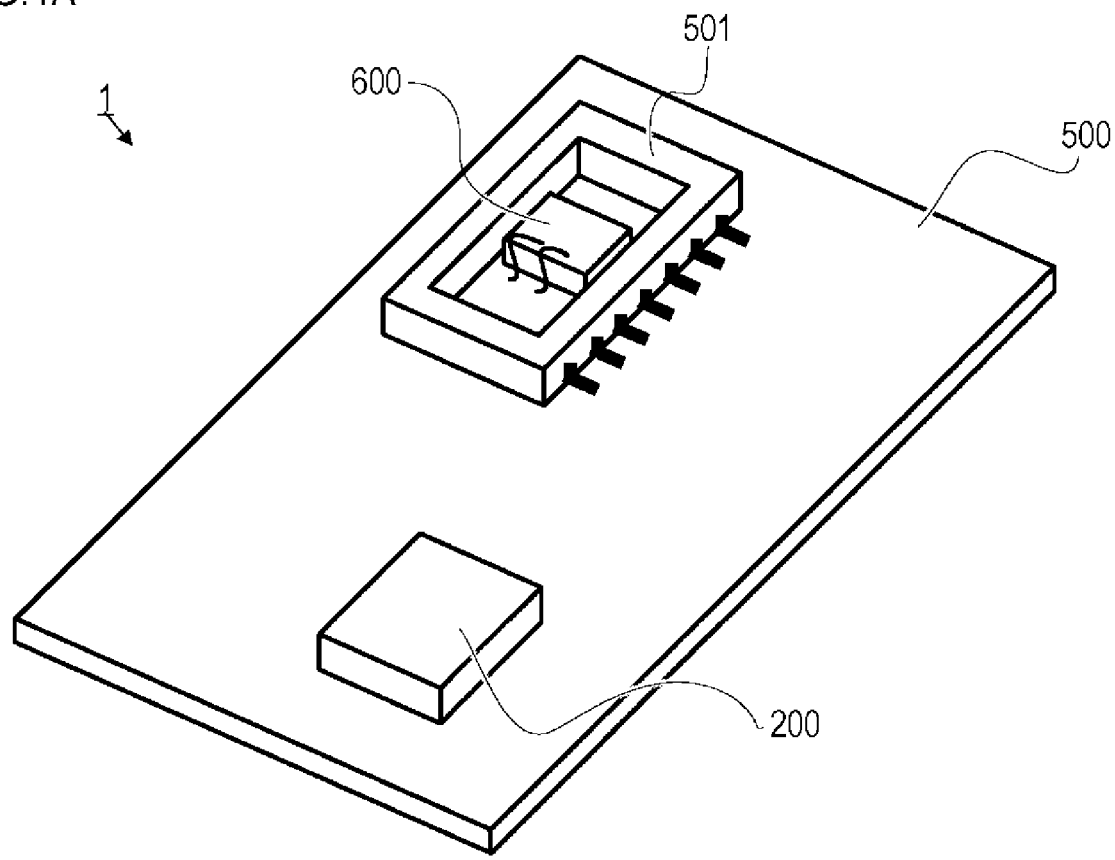
FIGS. 4A and 4B are diagrams each illustrating an external configuration of the oscillator according to the first embodiment.

An external configuration of the oscillator 1 will be described below with reference to FIGS. 4A to 6B. FIG. 4A is a schematic diagram illustrating an external configuration of the oscillator 1 of the present embodiment, and FIG. 4B is a schematic diagram illustrating a chip 600 included in the oscillator 1 and its periphery in more detail.

The oscillator 1 includes a printed circuit board (PCB) 500, a package (PKG) 501, a chip 600, and the voltage bias circuit 200, as illustrated in FIG. 4A.

Figure 4B:
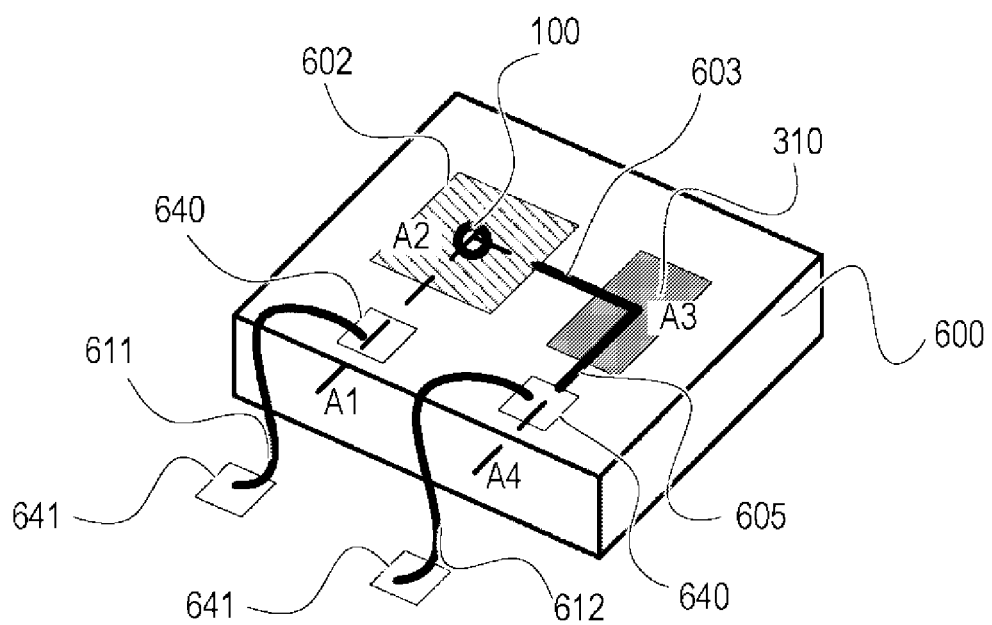
Figure 7A:
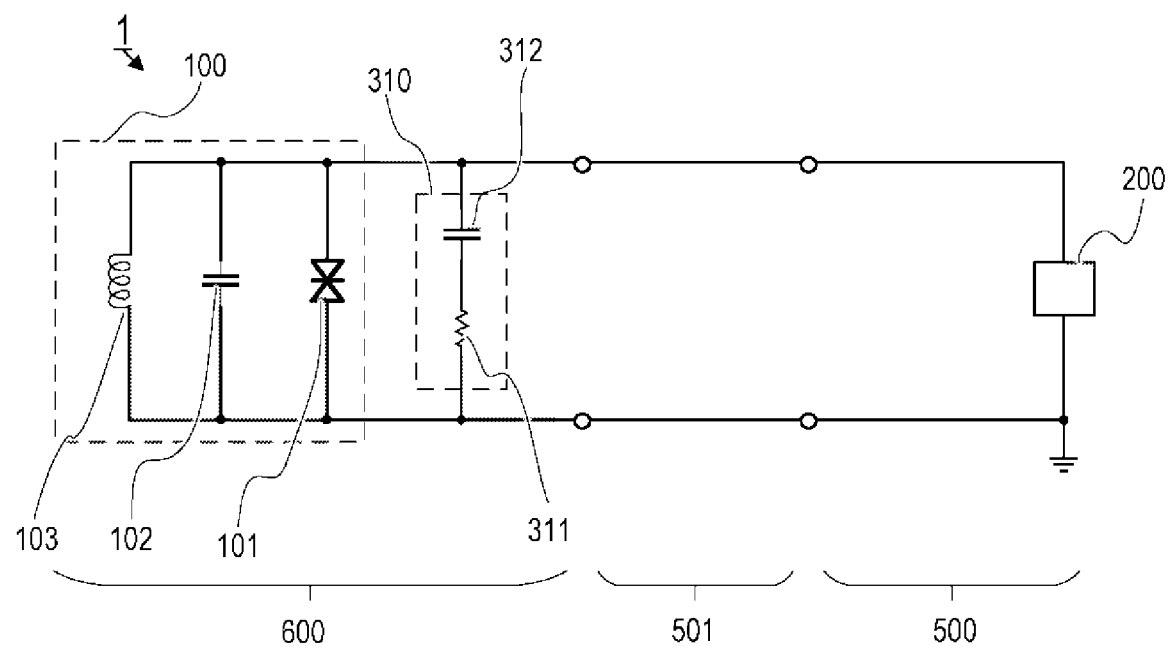
FIG. 7A is a circuit configuration diagram of the oscillator according to the first embodiment.

As illustrated in FIG. 4B, the chip 600, a wire 611, a wire 612, and electrodes 641 for wire bonding are formed on the chip 600 and its periphery. The chip 600 includes the oscillation circuit 100 including the negative resistance element 101, the shunt element 310, an antenna 602, a wire 603, a wire 605, and two electrodes 640 for wire bonding. Therefore, in the present embodiment, the oscillator 1 has a circuit configuration as illustrated in FIG. 7A, the oscillation circuit 100 and the shunt element 310 are formed on the chip 600, and the voltage bias circuit 200 is formed on the printed circuit board 500.

The chip 600 is mounted in the package 501. As illustrated in FIG. 4B, the two electrodes 640 of the chip 600 are electrically connected to the two electrodes 641 included in the package 501 by wire bonding using the wires 611 and 612, respectively. It is to be noted that as the chip 600 is typically a slightly less than 1 mm square to several mm square chip when used, but may be as large as a 10 mm square chip.

Further, on the printed circuit board 500, the package 501 and the voltage bias circuit 200 are mounted as illustrated in FIG. 4A. Accordingly, the oscillation circuit 100 and the voltage bias circuit 200 in the chip 600 are electrically connected via the wires of the printed circuit board 500 and the package 501. As a result, a DC voltage of voltage value Vop is applied from the voltage bias circuit 200 to the oscillation circuit 100, so that the oscillation circuit 100 is set to perform terahertz oscillation at the terahertz frequency ft.

Figure 5A:
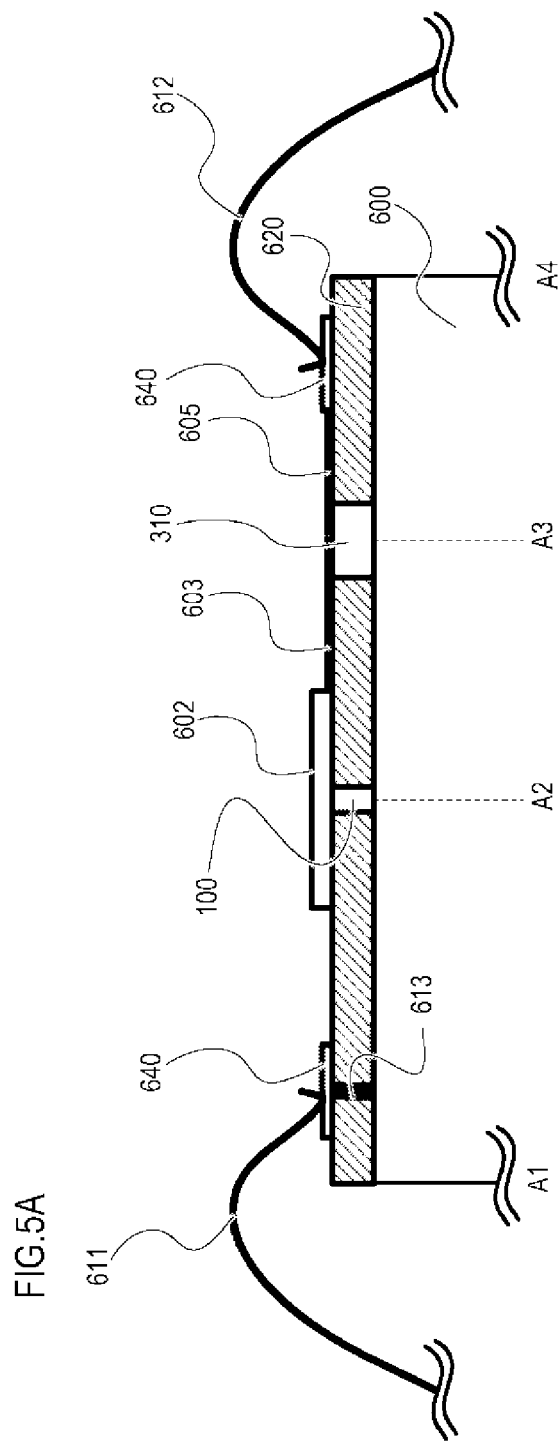
FIGS. 5A and 5B are diagrams each illustrating an external configuration of the oscillator according to the first embodiment.

FIG. 5A is a diagram schematically illustrating an A1-A2-A3-A4 cross section of the chip 600 of FIG. 4B. As illustrated in FIG. 5A, an insulating film 620 is formed on the chip 600. The oscillation circuit 100 is formed on the chip 600 so as to be embedded in the depth direction of the insulating film 620, and one terminal of the oscillation circuit 100 is connected to the chip 600 (a substrate potential of the chip 600). The other terminal of the oscillation circuit 100 is connected to the antenna 602 formed on the chip 600. It is to be noted that the substrate potential of the chip 600 is connected to the electrode 640 by a wire 613 penetrating the insulating film 620.

One terminal of the shunt element 310 is connected to the chip 600 (the substrate potential of the chip 600). The other terminal of the shunt element 310 is connected to the antenna 602 through the wire 603 and to the electrode 640 through the wire 605. Accordingly, in the present embodiment, the wire 603 is a wire for connecting the shunt element 310 and the oscillation circuit 100 (the negative resistance element 101).

The size of the antenna 602 may be set to an optimum size according to the terahertz frequency ft. For example, the size of the antenna 602 ranges from a hundred jam square to a few hundred μm square. It is to be noted that as the antenna 602, a larger antenna of several mm square can be used depending on the terahertz frequency ft. Further, the antenna 602 of the oscillator 1 according to the present embodiment is not limited to a square antenna, and may have any antenna shape as long as it can output the predetermined electromagnetic wave (terahertz wave).

Detailed Configuration of Shunt Element

A detailed configuration example of the shunt element 310 will be described with reference to FIGS. 6A and 6B. FIG. 6A is an enlarged schematic diagram of the vicinity of the shunt element 310 illustrated in FIG. 4B.

The shunt element 310 is connected to a contact point B0 between the wire 603 extending to the antenna 602 and the wire 605 extending to the electrode 640. As illustrated in FIG. 6A, a resistor part 631 of the resistive element 311 is connected to the contact point B0, and an upper electrode 632 of the capacitive element 312 is connected at the distal end of the resistor part 631.

FIG. 6B is a schematic diagram of the shunt element 310 when cut along the B1-B2 cross section of FIG. 6A. A lower electrode 633 having the same size as the upper electrode 632 is formed on the chip 600, and a capacitor is formed by sequentially stacking the lower electrode 633, a dielectric film 634, and the upper electrode 632. Specifically, the shunt element 310 includes, as the capacitive element 312, a MIM (Metal-Insulator-Metal) capacitor having a structure in which the dielectric film 634 (insulating film) is sandwiched between the metal lower electrode 633 and the metal upper electrode 632.

Since the lower electrode 633 is electrically connected to the chip 600, the shunt element 310 is electrically arranged in parallel to both terminals of the negative resistance element 101.

The resistor part 631 can be easily formed by forming a pattern on a metal thin film so that it has a long wiring length. The configuration in which the configuration with the long wiring length is a meander wiring configuration in the example illustrated in FIG. 6A. As the metal thin film, any type of thin film can be used as long as it is a metal used for semiconductor wiring, such as aluminum. Further, the resistance value (sheet resistance value) of the metal thin film can be easily adjusted by adjusting the type of metal, the width, thickness, length, etc. of the wiring. It is to be noted that instead of the metal thin film, any resistor may be used as long as it can be formed into a desired resistor on the chip 600, including a polysilicon resistor whose resistance value is controlled by adjusting the doping amount to polysilicon.

The dielectric film 634 can be easily formed using a silicon oxide film, a silicon nitride film, or the like. Specifically, the dielectric film 634 can be formed by selecting a low dielectric constant material or a high dielectric constant material in accordance with a desired dielectric constant.

The upper electrode 632 and the lower electrode 633 can be easily formed from a metal material such as aluminum. Here, for the lower electrode 633, it is necessary to select a material that can withstand a temperature generated in a step of forming the dielectric film 634. Further, as the upper electrode 632 and the lower electrode 633, any type may be used as long as one having a desired capacitance value, including a capacitor using polysilicon as upper and lower electrodes and a MOS capacitor can be provided on the chip 600. Further, if there is no problem in use, a configuration not including the lower electrode 633 can be similarly used by substituting the chip 600 for the lower electrode 633.

It is to be noted that in the present embodiment, the insulating film 620 and the dielectric film 634 are formed of different materials, but are not limited to this. For example, the same insulating film such as a silicon oxide film or a silicon nitride film may be used for the insulating film 620 and the dielectric film 634 as long as they have a desired capacitance value. Using the same insulating film does not require to form different insulating films (dielectric films) on the same chip 600, which makes it possible to form the chip 600 with a simpler structure and a simple manufacturing process.

Further, in the present embodiment, since the oscillation circuit 100 and the shunt element 310 are formed on the chip 600 that is the same member, it is possible to shorten the length of the wire between the negative resistance element 101 and the shunt element 310 (length of the wire 603). In other words, it is possible to easily set the length of the wire 603 connecting the negative resistance element 101 and the shunt element 310 to be not more than the length of ¼ of the wavelength λm of the predetermined electromagnetic wave. Accordingly, with such a small size configuration of the oscillator 1, it is possible to provide stable suppression of parasitic oscillation while preventing an increase in power consumption.

Figure 5B:
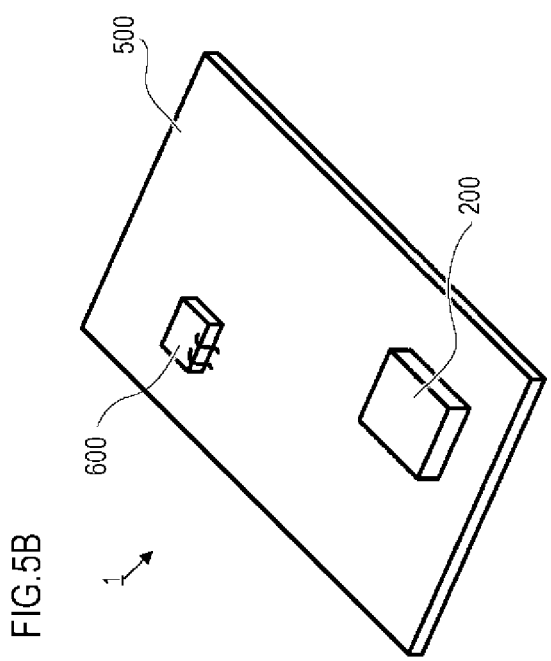

It is to be noted that in the present embodiment, the configuration in which the chip 600 is formed on the package 501 has been described, but the present invention is not limited to this configuration. For example, as illustrated in FIG. 5B, a configuration in which the chip 600 is formed directly on the printed circuit board 500 without the package 501 may be used. This makes it possible to eliminate the package 501 in the oscillator 1, thereby configuring the oscillator 1 with fewer components.

Advantageous Effect

According to the present embodiment, in an oscillator that causes an oscillation circuit including a negative resistance element to oscillate at a predetermined frequency, it is possible to prevent an increase in power consumption and provide stable suppression of parasitic oscillation.

Second Embodiment

Figure 8:
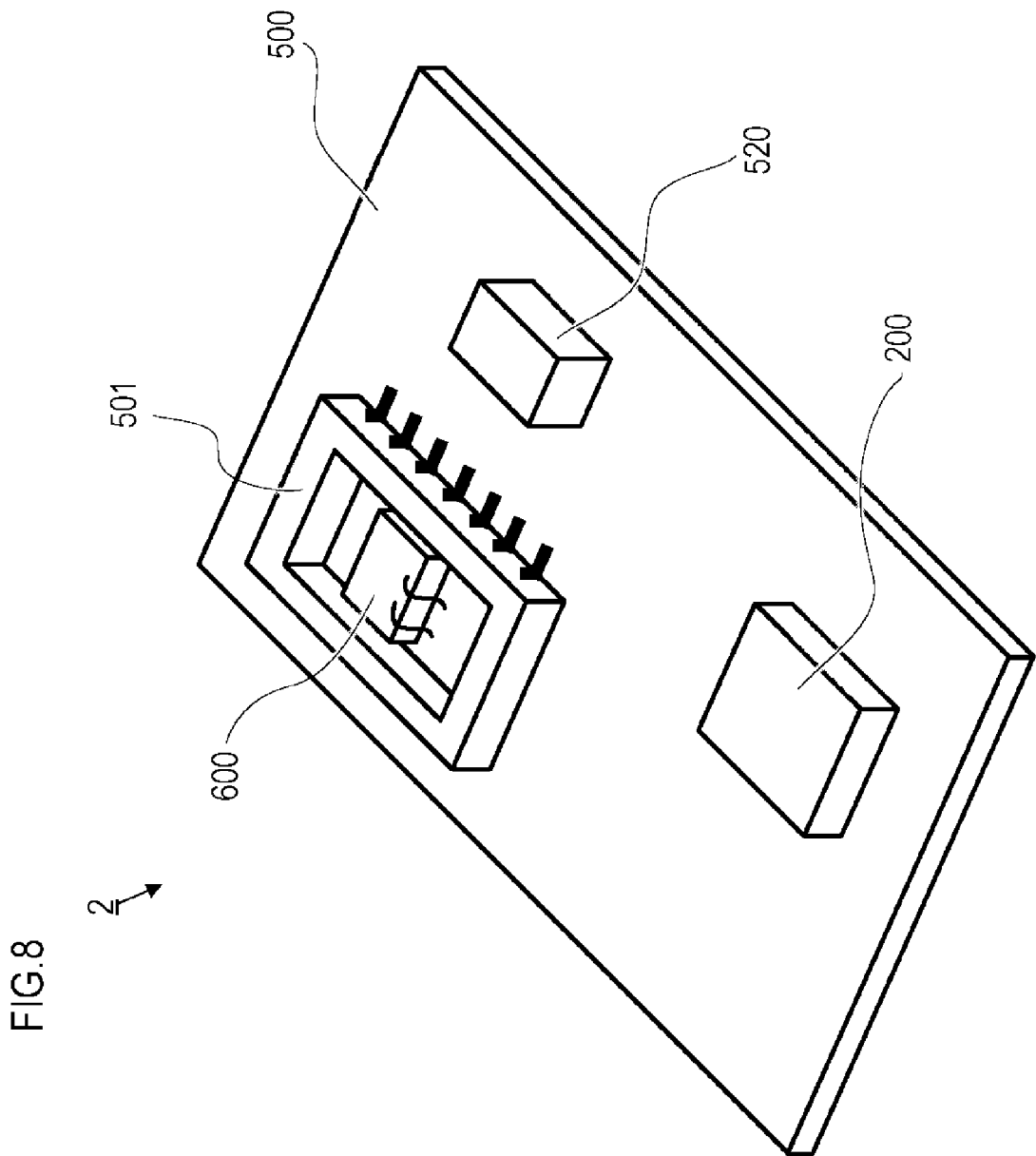
FIG. 8 is a diagram illustrating an external configuration of the oscillator according to the second embodiment.

An oscillator 2 according to a second embodiment is the same as the oscillator 1 according to the first embodiment except for the number of shunt elements and their arrangement place. The oscillator 2 according to the present embodiment will be described below with reference to FIG. 8. In the oscillator 2 according to the present embodiment, two shunt elements are formed on different members (the chip and the printed circuit board).

The oscillator 2 includes a shunt element 520 on the printed circuit board 500 in addition to the printed circuit board 500, the package 501, the chip 600, and the voltage bias circuit 200 included in the oscillator 1 according to the first embodiment.

The chip 600 includes a capacitive element 302 as a shunt element in place of the shunt element 310 of the first embodiment. The capacitive element 302 is designed such that the length of the wire connecting the capacitive element 302 and the oscillation circuit 100 (negative resistance element 101) is within ¼ of λm, to suppress parasitic oscillation with a high frequency not more than the terahertz frequency ft. Specifically, for example, as illustrated in FIG.

9A, the capacitive element 302 has a loss L4 around the parasitic oscillation frequency fp2 which is not more than the terahertz frequency ft. It is to be noted that the length of the wire connecting the capacitive element 302 and the oscillation circuit 100 (negative resistance element 101) is not necessarily within λm/4. That length has only to be not more than ¼ of the wavelength of an electromagnetic wave having the maximum parasitic oscillation frequency fp2 the oscillation of which is to be suppressed by the capacitive element 302 (which has a loss).

Figure 9A:
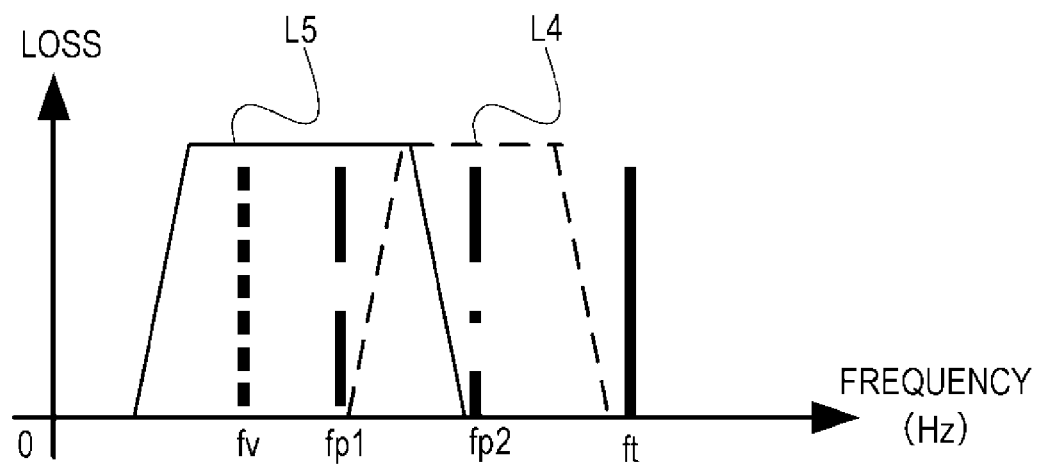
FIG. 9A illustrates a loss of electromagnetic waves according to the second embodiment.

On the other hand, the capacitive element 302 cannot sufficiently suppress parasitic oscillation at not more than a specific frequency (e.g., the parasitic oscillation frequency fp1). For this reason, the shunt element 520 that suppresses the parasitic oscillation at not more than such a specific frequency is formed on the printed circuit board 500. Specifically, for example, the shunt element 520 has a loss L5 around the parasitic oscillation frequencies fp1 and fv as illustrated in FIG. 9A.

Figure 7B:
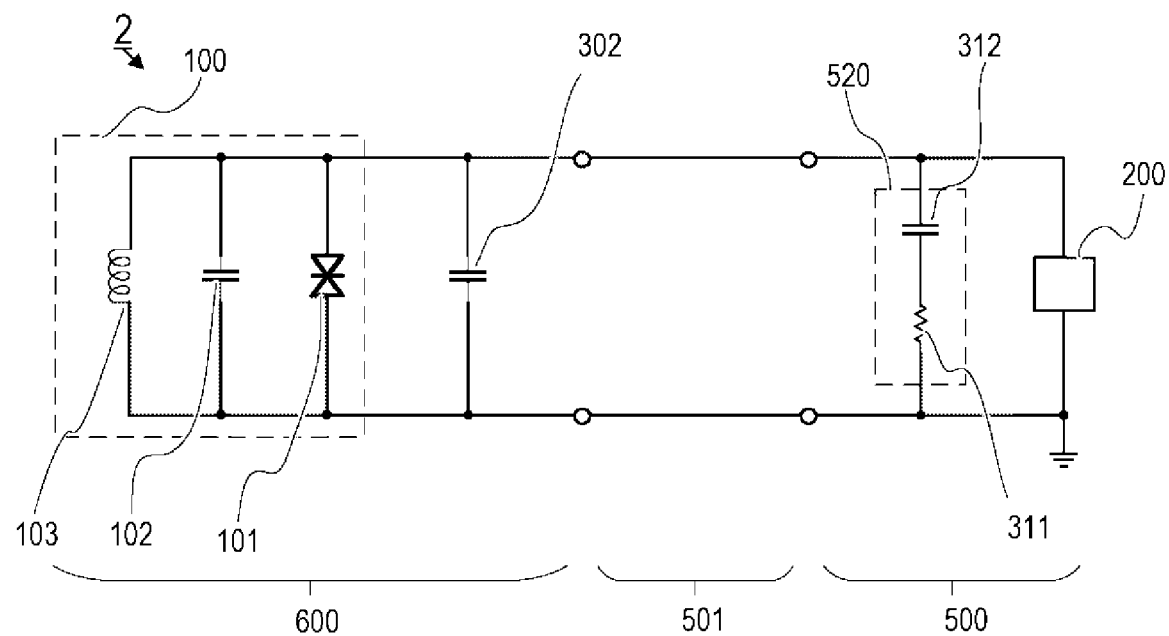
FIG. 7B is a circuit configuration diagram of an oscillator according to a second embodiment.

Further, the shunt element 520 is set such that the length of the wire connecting the shunt element 520 and the oscillation circuit 100 (negative resistance element 101) is within ¼ of a wavelength λp1 of the parasitic oscillation frequency fp1. It is to be noted that the shunt element 520 includes the resistive element 311 and the capacitive element 312 in the same manner as the shunt element 310 described in the first embodiment, as illustrated in FIG. 7B, in order to obtain the effect of preventing an increase in power consumption. In addition, the resistive element 311 and the capacitive element 312 included in the shunt element 520 are preferably designed to satisfy the conditions on resistance value and capacitance value described in the first embodiment.

In this way, in the present embodiment, since the capacitive element 302 suppresses high-frequency parasitic oscillation, it is possible to dispose the shunt element 520 farther from the oscillation circuit 100. Therefore, even when a large component that is difficult to form on the chip 600 is used for the shunt element 520, the shunt element 520 can be disposed at an appropriate position.

It is to be noted that the shunt element 520 is preferably formed using a surface mount chip component such as a chip resistor or a chip capacitor. This is because the resistance value of the resistive element 311 and the capacitance value of the capacitive element 312 can be selected as any value.

For example, the chip resistor is formed by screen-printing a resistor such as a metal thin film on an alumina substrate, so that various resistance values and accuracy can be realized. Further, the chip capacitor is formed by laminating several layers each having a structure in which a dielectric sheet is sandwiched between internal electrodes, and pressing and baking the laminate. Accordingly, the chip capacitor can have a small capacitance value (e.g., several pF) to a large capacitance value (e.g., several hundred μF) depending on the selection of the number of laminated layers and/or the dielectric sheet to be used.

Therefore, in the present embodiment, it is possible to easily select a large capacitance value for the shunt element 520, thereby providing more stable suppression of parasitic oscillation in a case where parasitic oscillation occurs at a lower frequency. In addition, the form in which the shunt element 520 is provided on a member different from the chip 600 on which the oscillation circuit 100 is formed, has advantages of easy improvement of yield, easily change in the design of the shunt element 520, and easy customization.

In the present embodiment, the capacitive element 302 is used as the shunt element formed in the chip 600. However, an element in which the capacitive element and the resistive element are electrically connected in series may be used as the shunt element.

This enables the oscillator to provide stable suppression of parasitic oscillation in a wide frequency range from the terahertz frequency band to a sufficiently low frequency band. Furthermore, since chip components are used for the shunt element 520, it is possible to more reliably suppress the parasitic oscillation with less design restriction.

Third Embodiment

Figure 10A:
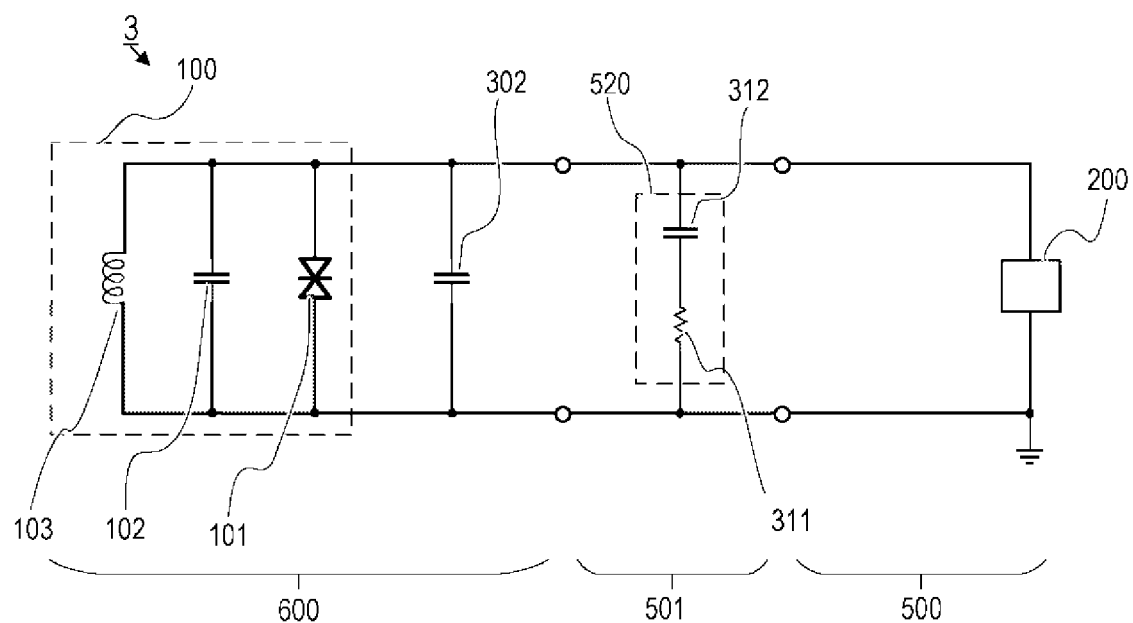
FIG. 10A is a circuit configuration diagram of an oscillator according to the third embodiment.

In the oscillator 2 according to the second embodiment, the shunt element 520 is formed on the printed circuit board 500. However, in an oscillator 3 according to a third embodiment, the shunt element 520 is formed in the package 501 as illustrated in a circuit configuration diagram of FIG. 10A. The following description for the oscillator 3 according to the third embodiment will focus on different parts from the second embodiment with reference to FIGS. 11A and 11B.

Figure 11A:
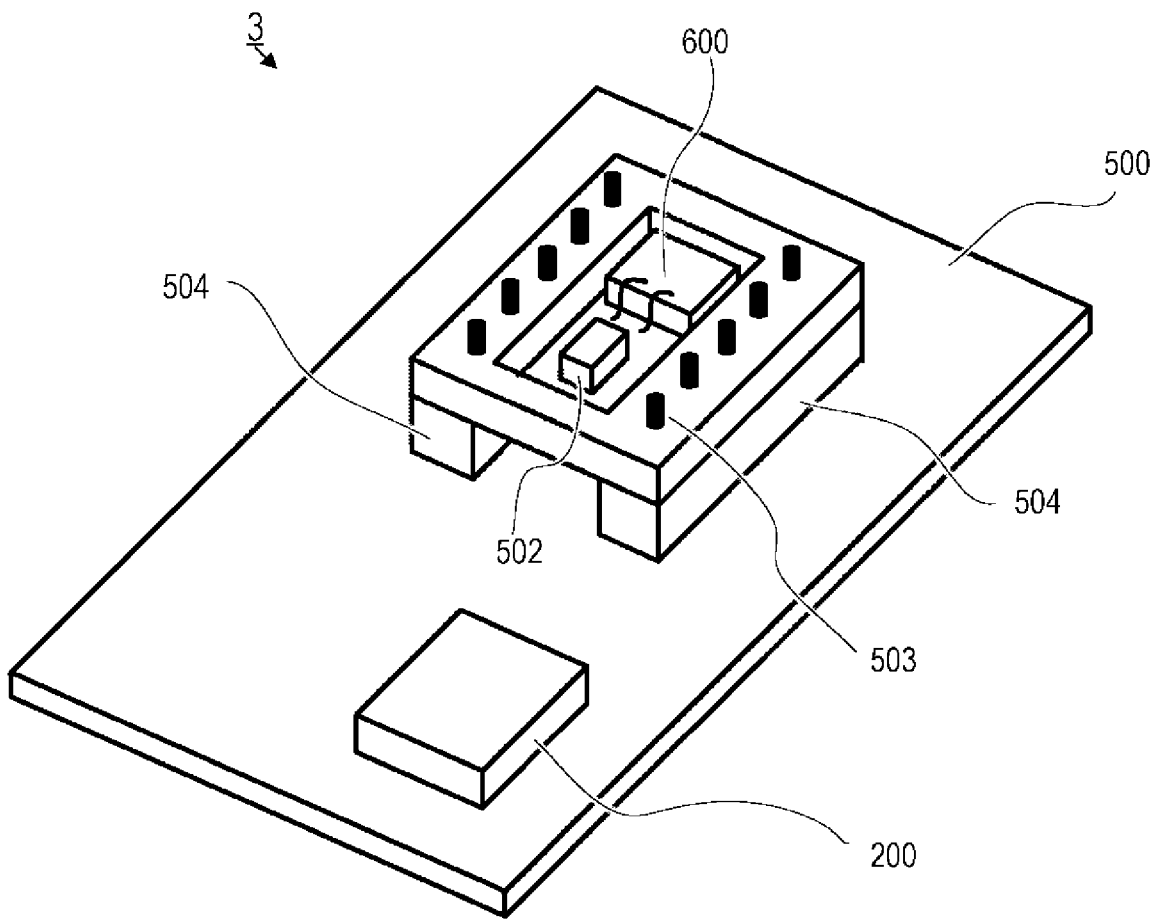
FIGS. 11A and 11B are diagrams each illustrating an external configuration of the oscillator according to the third embodiment.
Figure 11B:
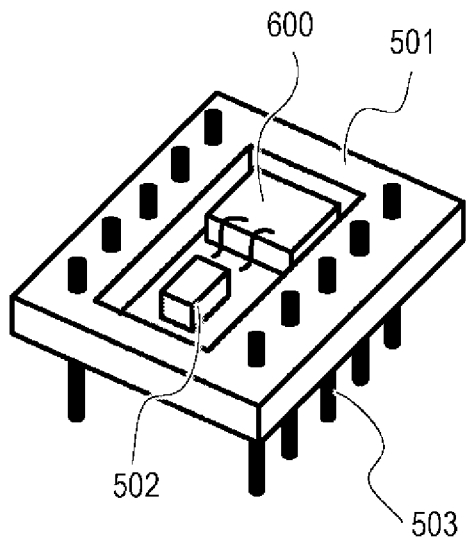

FIG. 11A is a schematic diagram illustrating the oscillator 3 of the present embodiment. The package 501 includes pins 503, and the printed circuit board 500 includes a pin socket 504 for the pins 503. Accordingly, the package 501 including the chip 600 can be inserted into and removed from the printed circuit board 500 as illustrated in FIG. 11B. Thus, in a case where a user desires to change the characteristics of the oscillator 3 or in a case where the oscillator 3 breaks down and needs to be replaced, it is possible to easily cope with such a case by replacing the package 501.

On the other hand, the wire connecting the package 501 and the printed circuit board 500 includes a parasitic element, such as a parasitic inductor or a parasitic capacitor, caused by the pin socket 504. For this reason, the oscillator 3 is more likely to generate parasitic oscillation and more easily interfere with terahertz wave oscillation than the oscillator 2 according to the second embodiment.

However, according to the configuration of the present embodiment, since the parasitic oscillation can be suppressed by the shunt element 520 in the package 501, the terahertz wave oscillation can be stabilized even when a parasitic element is added outside the package 501. Specifically, according to the present embodiment, even when the pin socket 504 has a parasitic element, the loss of electromagnetic waves even at a sufficiently low frequency can occur in the package 501, making it possible to suppress the parasitic oscillation.

It is to be noted that a condition on length of the wire connecting the oscillation circuit 100 (negative resistance element 101) and the shunt element 520 and a condition on length of the wire connecting the oscillation circuit 100 (negative resistance element 101) and the capacitive element 302 are satisfied as in the second embodiment. Further, the shunt element is not limited to the capacitive element 302. An element in which a capacitive element and a resistive element are electrically connected in series may be used as the shunt element in place of the capacitive element 302.

Therefore, the oscillator according to the present embodiment can be easily replaced, and can prevent an increase in power consumption and provide stable suppression of parasitic oscillation.

Fourth Embodiment

Figure 12A:
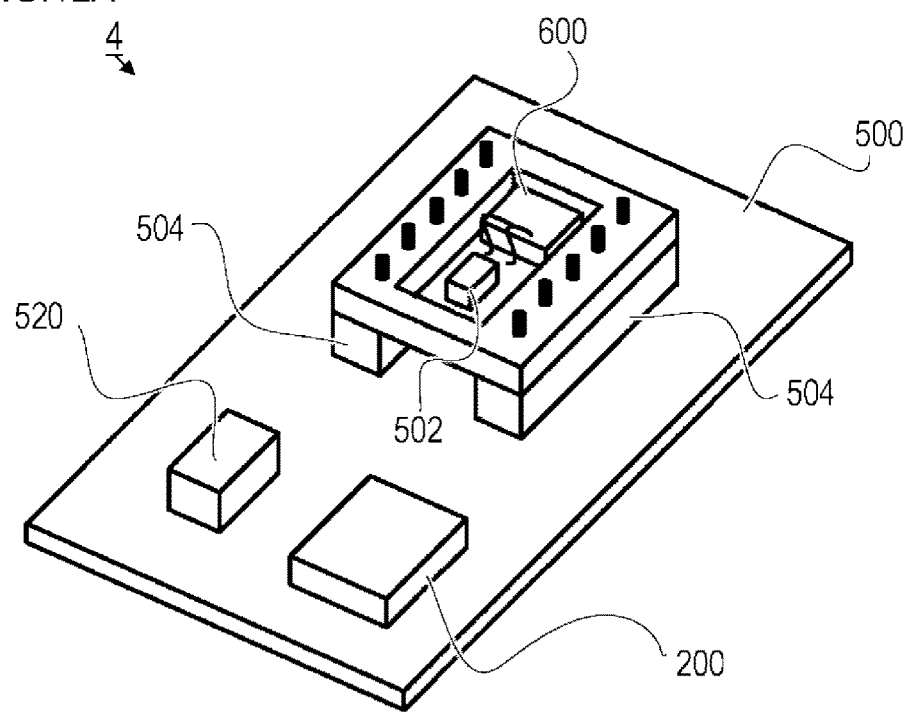
FIG. 12A is a diagram illustrating an external configuration of the oscillator according to the fourth embodiment.

A fourth embodiment is an embodiment in which the second embodiment and the third embodiment are combined. More specifically, in the present embodiment, three shunt elements are formed on different members (chip, package, printed circuit board). As illustrated in FIG. 12A, an oscillator 4 according to the present embodiment includes a capacitive element 502 having the same configuration as the capacitive element 302 on the printed circuit board 500 as in the second embodiment. Further, in the oscillator 4, the package 501 can be inserted into and removed from the printed circuit board 500 as in the third embodiment.

Figure 9B:
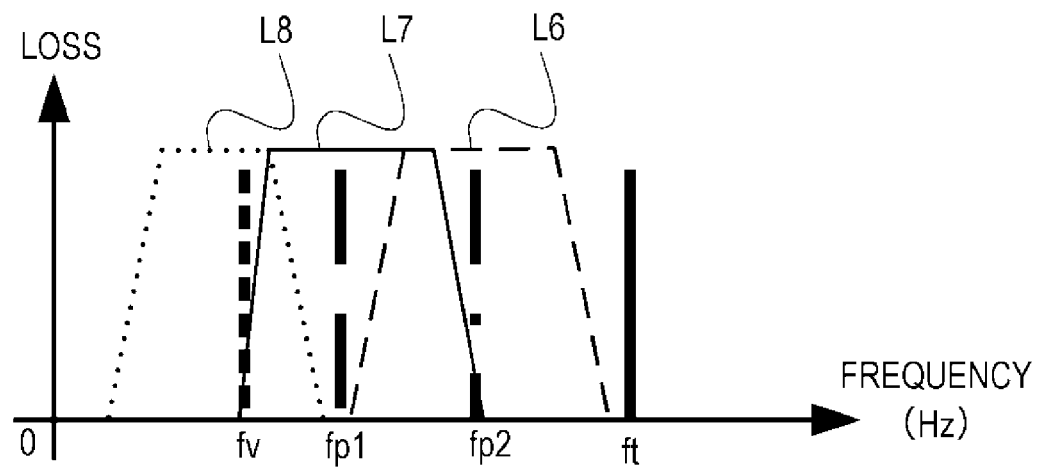
FIG. 9B illustrates a loss of electromagnetic waves according to a third embodiment.
Figure 10B:
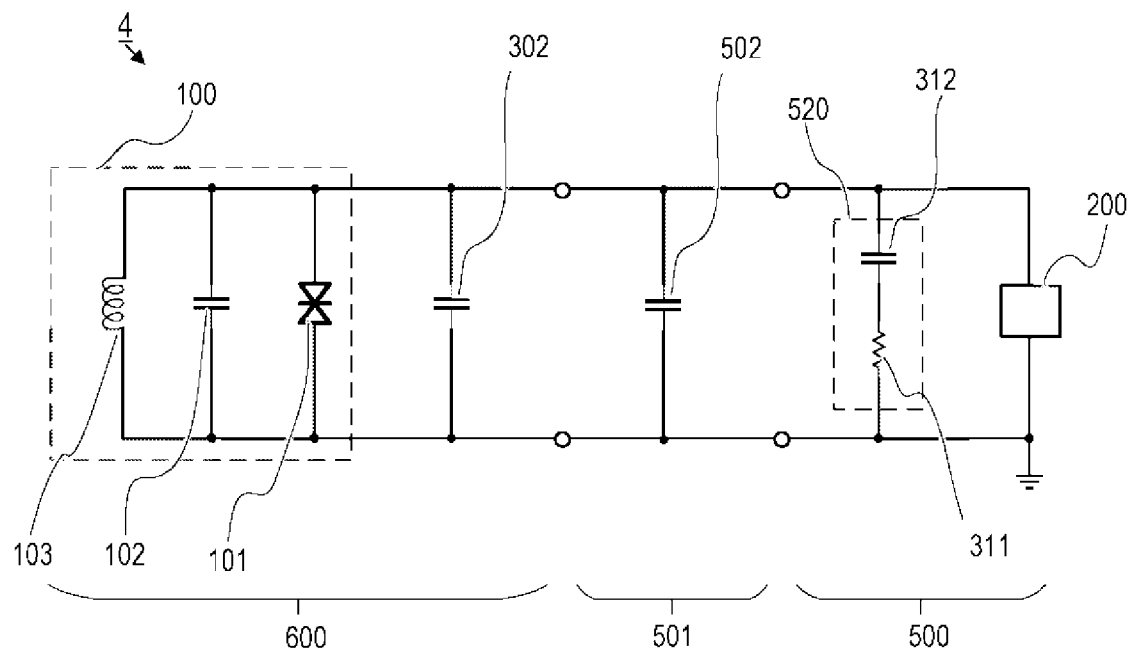
FIG. 10B is a circuit configuration diagram of an oscillator according to a fourth embodiment.

In the chip 600, as illustrated in FIG. 10B, the capacitive element 302 is formed as a shunt element. On the other hand, the capacitive element 502 is formed as a shunt element in the package 501. Further, the shunt element 520 having the resistive element 311 and the capacitive element 312 is formed on the printed circuit board 500. The capacitive elements 302 and 502 and the shunt element 520 each have a parameter set so as to suppress different parasitic oscillations, and the frequency characteristics of loss are continuous as illustrated in FIG. 9B.

For example, in the present embodiment, as illustrated in FIG. 9B, the capacitive element 302 connected to the oscillation circuit 100 by a short wire has a loss L6 that suppresses the oscillation of the electromagnetic wave having the parasitic oscillation frequency fp2 which is a high-frequency. On the other hand, the capacitive element 502 connected to the oscillation circuit 100 by a wire having a long wire has a loss L7 that suppresses the oscillation of the electromagnetic wave having the parasitic oscillation frequency fp1. In addition, the shunt element 520 that requires a longer wire than the wire for the capacitive element 502 has a loss L8 that suppresses the oscillation of the electromagnetic wave having the parasitic oscillation frequency fv.

In other words, the capacitive elements 302 and 502 and the shunt element 520 each suppress the oscillation of the electromagnetic wave in a higher frequency band as the wire for connection to the oscillation circuit 100 (negative resistance element 101) is shorter. Further, the capacitive elements 302 and 502 and the shunt element 520 are each connected to the oscillation circuit 100 (negative resistance element 101) by a wire having a length not more than ¼ of the wavelength of an electromagnetic wave having the maximum frequency the parasitic oscillation of which is to be suppressed by the element itself (which has a loss). It is to be noted that as described above, the wavelength of an electromagnetic wave having the maximum frequency the parasitic oscillation of which is to be suppressed (which has a loss) may be referred to as a cut-off frequency on the high frequency side.

It is to be noted that the shunt element is not limited to the capacitive elements 302 and 502. An element in which a capacitive element and a resistive element are electrically connected in series may be used as the shunt element in place of the capacitive elements 302 and 502.

With the oscillator according to the present embodiment, it is possible to suppress the parasitic oscillation for each portion to be connected (chip to package, package to printed circuit board, printed circuit board to voltage bias circuit) by using a plurality of shunt elements. Therefore, the parameter of each shunt element can be set to a more optimal parameter, which results in required minimum design values.

Fifth Embodiment

An oscillator 5 according to a fifth embodiment is the same as the oscillator 1 according to the first embodiment except that the arrangement place of the voltage bias circuit is different from that of the oscillator 1 according to the first embodiment.

Figure 12B:
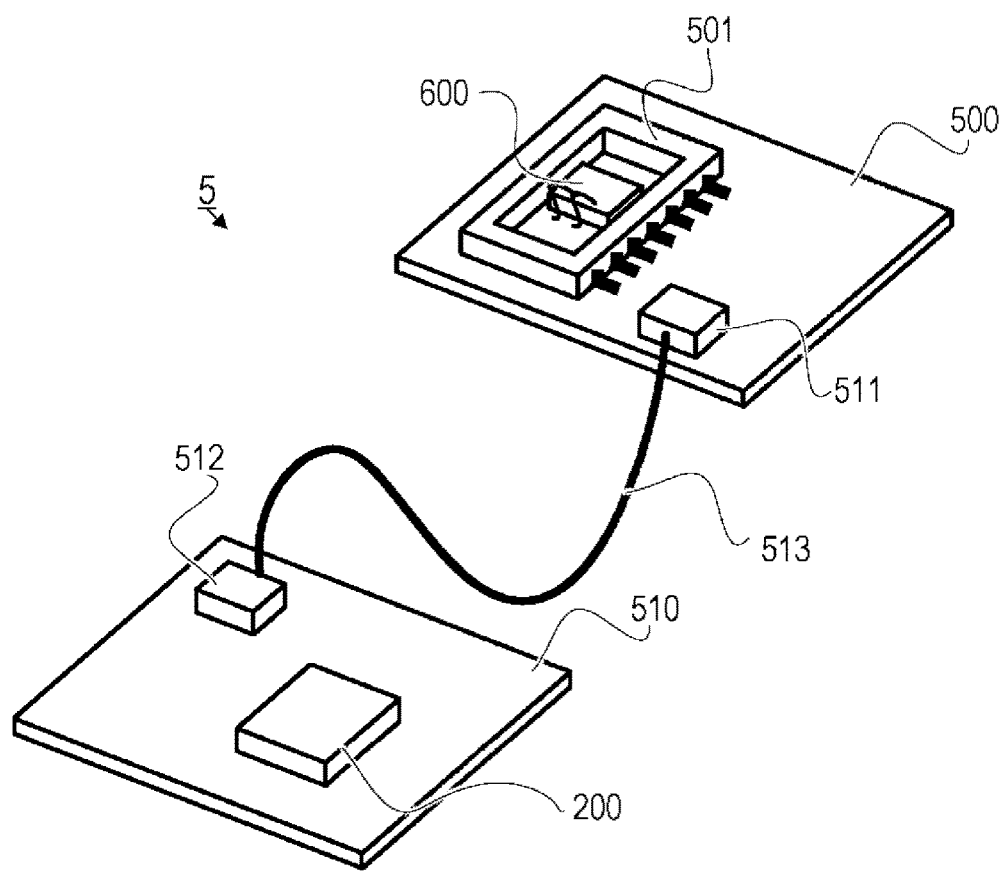
FIG. 12B is a diagram illustrating an external configuration of an oscillator according to a fifth embodiment.

In the present embodiment, as illustrated in FIG. 12B, the voltage bias circuit 200 is not formed on the printed circuit board 500 including the package 501, but is formed on another printed circuit board 510. Here, the printed circuit board 500 and the printed circuit board 510 are electrically connected by a cable 513. Specifically, a connector 511 on the printed circuit board 500 and a connector 512 on the printed circuit board 510 are connected by a cable 513.

Accordingly, the voltage bias circuit 200 formed on the printed circuit board 510 can apply the voltage Vop to the chip 600 in the package 501 via the cable 513.

In the present embodiment, even if there is a parasitic element between the oscillation circuit 100 and the voltage bias circuit 200, the shunt element 310 makes it possible to suppress the parasitic oscillation. Accordingly, even if the voltage bias circuit 200 is separately disposed on the other printed circuit board 510, the oscillator 5 can produce the predetermined electromagnetic wave (terahertz wave) through the cable 513.

Therefore, according to the present embodiment, in the oscillator, a section where the predetermined electromagnetic wave is produced (a section having the oscillation circuit) and the voltage bias circuit can be separated, and thus it is possible to set the arrangement more feely with less restrictions on design for the section where the predetermined electromagnetic wave is produced.

Sixth Embodiment

In the oscillator 1 according to the first embodiment, the voltage bias circuit applies a DC voltage across the negative resistance element. However, in an oscillator 6 according to the present embodiment, the voltage bias circuit applies an AC voltage across the negative resistance element. It is to be noted that the oscillator 6 has the same configuration as the oscillator 1 according to the first embodiment except for the application of an AC voltage.

Figure 13A:
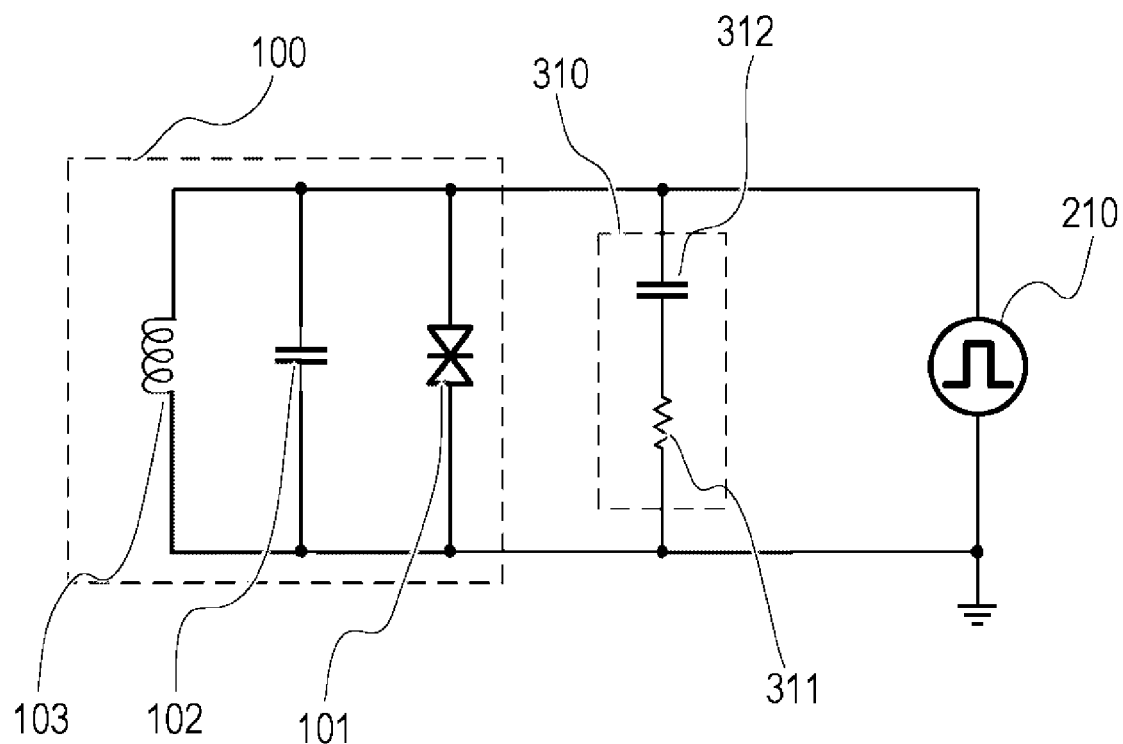
FIGS. 13A and 13B are for explaining the oscillator according to a fifth embodiment.
Figure 13B:
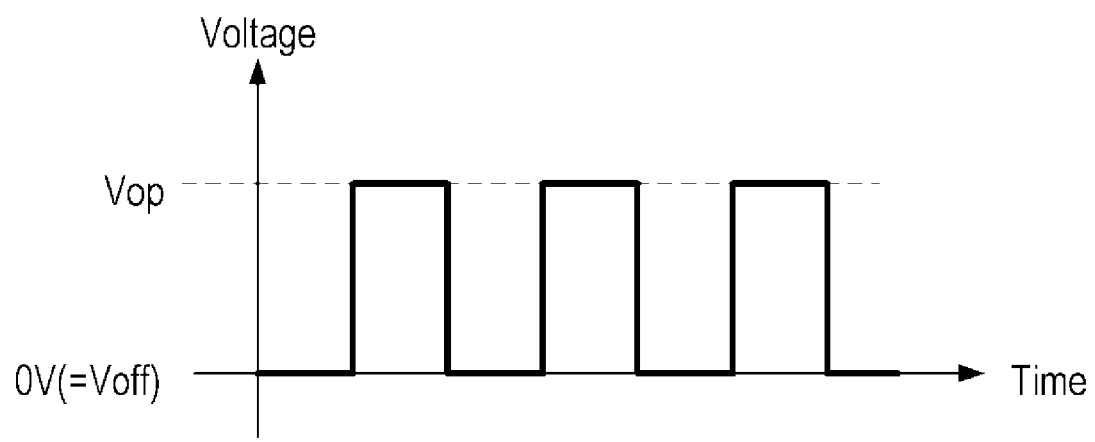

As illustrated in FIG. 13A, a voltage bias circuit 210 applies an alternating current voltage (AC voltage) to the oscillation circuit 100 (negative resistance element 101). Specifically, as illustrated in FIG. 13B, a voltage changing with a certain frequency is used as the AC voltage, which is between a voltage value Vop for producing a predetermined electromagnetic wave and a voltage value Voff for stopping the production of the predetermined electromagnetic wave. The voltage value Voff has only to be a voltage value outside the negative resistance region, and is 0 V, for example. Further, as illustrated in FIG. 13B, a voltage changing between two values: the voltage value Vop and the voltage value Voff by way of transition of pulse wave can be used as the AC voltage. As the frequency with which the voltage changes, a frequency that is sufficiently lower than the oscillation frequency of the predetermined electromagnetic wave is used.

The voltage bias circuit 210 operates more complicatedly than the voltage bias circuit 200 according to the first embodiment because of generating an AC voltage. Therefore, the voltage bias circuit 210 includes a larger element than the parasitic element included in the voltage bias circuit 200 according to the first embodiment, in which parasitic oscillation due to the voltage bias circuit 210 and the oscillation circuit 100 is likely to occur. However, the oscillator 6 can effectively suppress the parasitic oscillation by including the shunt element 310 even in such a configuration in which the parasitic oscillation is more likely to occur.

It is to be noted that in the shunt element 310, the frequency determined by the time constant of the capacitive element 312 and the resistive element 311 (the cut-off frequency on the low frequency side) needs to be higher than the frequency at which voltage bias circuit 210 changes voltage. For example, in a case where a rectangular wave voltage is used, the frequency determined by the time constant is preferably at least several times of the frequency at which voltage bias circuit 210 changes voltage.

According to the present embodiment, even in a case where the voltage bias circuit 210 for alternating current in which parasitic oscillation is more likely to occur is used, it is possible to prevent an increase in power consumption and provide stable suppression of parasitic oscillation.

Seventh Embodiment

The oscillator 1 according to the first embodiment is applicable to an imaging device (image acquisition device). Accordingly, an imaging device 10 using the oscillator 1 will be described in the present embodiment.

Figure 14A:
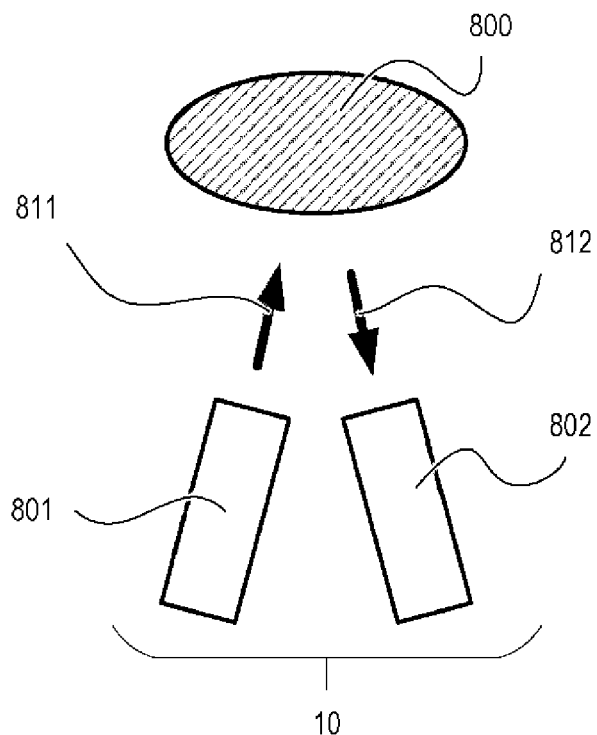
FIG. 14A is a diagram illustrating an imaging device according to a sixth embodiment.

As illustrated in FIG. 14A, the imaging device 10 includes an illumination 801 and an imaging element 802. The illumination 801 is an illumination device that includes the oscillator 1 according to the first embodiment to irradiate a subject 800 with a terahertz wave 811 (the predetermined electromagnetic wave). The image element 802 acquires (images) a terahertz wave 812 reflected from the subject 800. The image element 802 can acquire, as an image, information on the subject 800 that changes depending on the shape and/or physical property value of the subject 800.

In this way, the oscillator 1, also when used for the illumination 801, makes it possible to prevent an increase in power consumption and provide stable suppression of parasitic oscillation in the imaging device 10. Accordingly, it is possible to perform stable irradiation with terahertz waves with little variation in properties due to heat generation or the like. Therefore, according to the present embodiment, it is possible to provide the imaging device 10 that can acquire accurate information on the subject 800.

First Modification

Figure 14B:
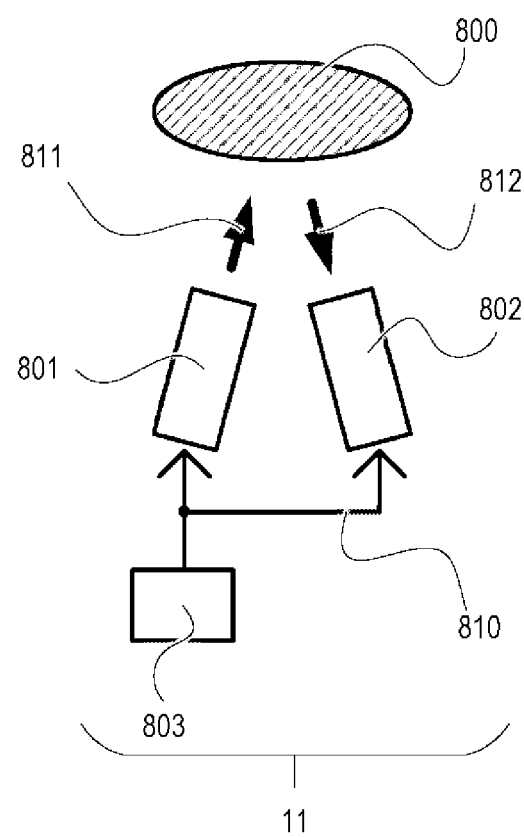
FIG. 14B is a diagram illustrating an imaging device according to a first modification.
Figure 15A:
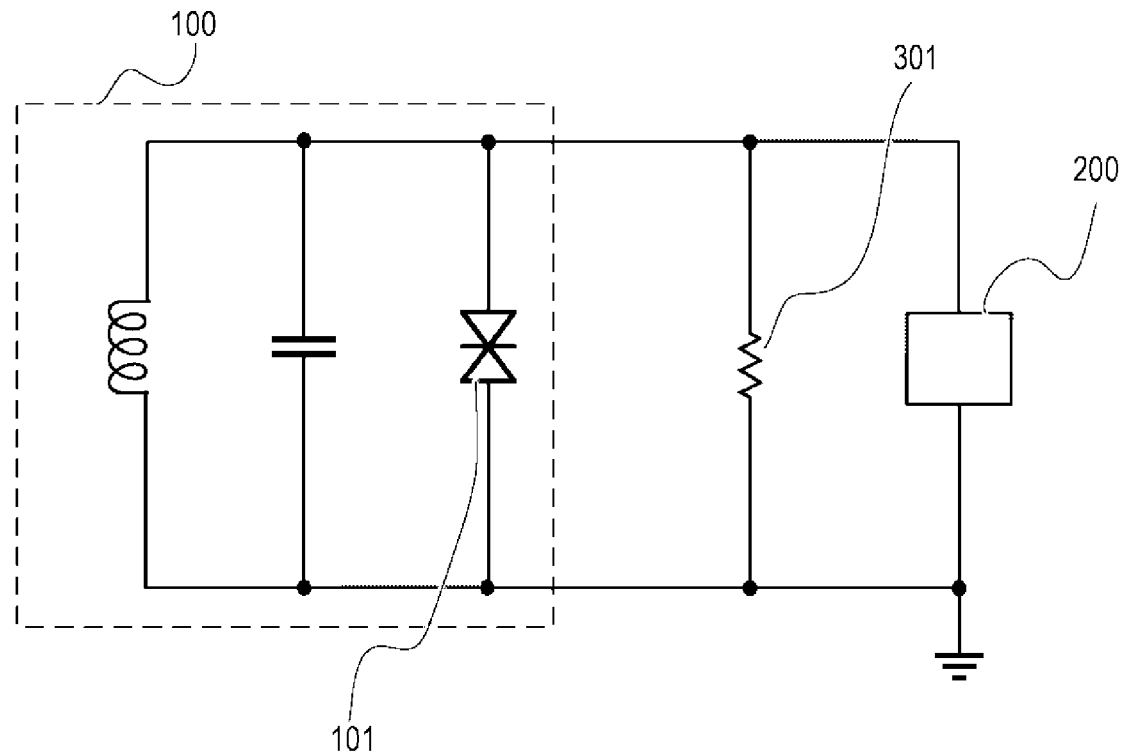
FIGS. 15A and 15B are circuit configuration diagrams each illustrating a conventional oscillator.
Figure 15B:
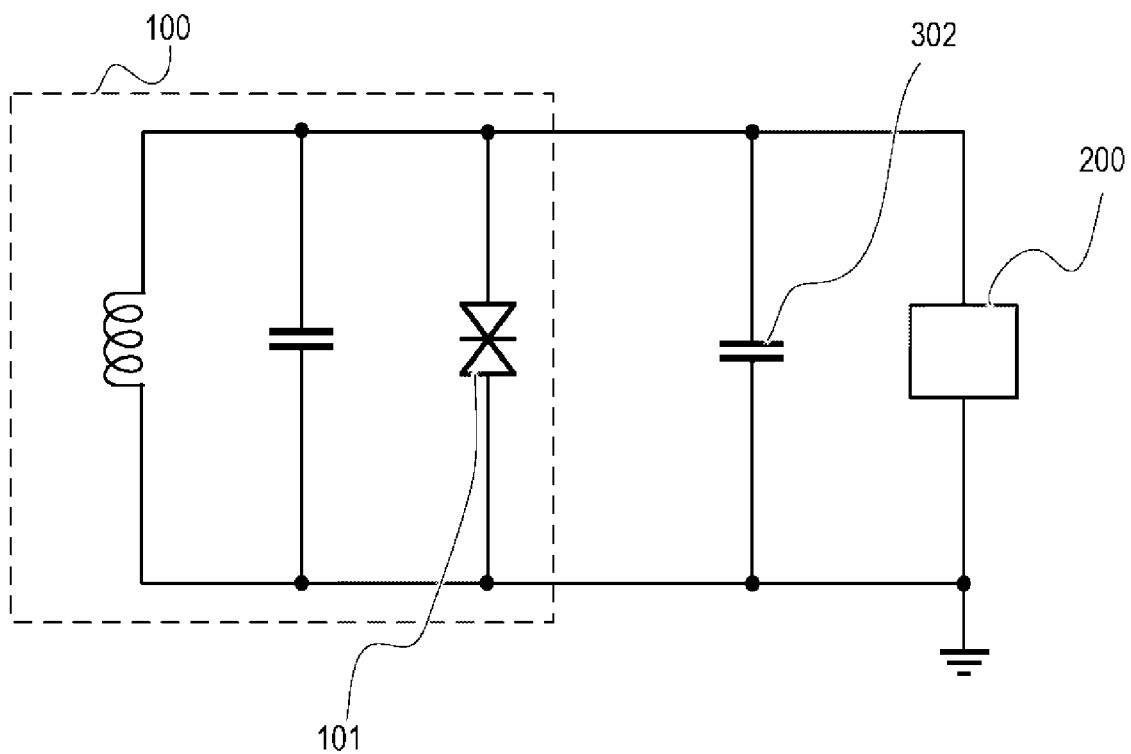

Furthermore, the illumination 801 is not limited to that used for the imaging device 10 according to the seventh embodiment, but may be used for an imaging device 11 including the oscillator 6 using the voltage bias circuit 210 of the sixth embodiment, as illustrated in FIG. 14B.

In FIG. 14B, the imaging device 11 includes the illumination 801 using the oscillator 6, the imaging element 802, and a timing generation unit 803. The timing generation unit 803 inputs a timing signal 810 to the illumination 801 using the oscillator 6 and to the imaging element 802.

The illumination 801 adjusts the voltage change timing of the voltage bias circuit 210 based on the input timing signal 810. The illumination 801, when repeatedly producing and stopping the terahertz wave 811 at the adjusted timing in a cycle, causes a period in which the subject 800 is irradiated with the terahertz wave 811 and a period in which the subject 800 is not irradiated with the terahertz wave 811.

On the other hand, the imaging element 802 performs imaging of the subject 800 in a period in which the illumination 801 emits the terahertz wave and a period in which the illumination 801 does not emit the terahertz wave, based on the input timing signal 810. Then, the imaging element 802 determines a difference between pieces of information imaged in the two periods. Based on the difference, the imaging element 802 can remove an electromagnetic wave component (noise component) that has not been intentionally emitted, thereby making it possible to improve the SN ratio (Signal to Noise Ratio) of the acquired image.

According to the present modification, it is possible to provide an imaging device (terahertz imaging device) that can acquire image information with a higher SN ratio.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-028242, filed on Feb. 20, 2019, which is hereby incorporated by reference herein in its entirety.

What is claimed is:
1. An oscillator comprising:
a resonator including a negative resistance element;
a voltage bias circuit configured to apply a voltage across the negative resistance element; and
a shunt element in which a resistor and a capacitor are electrically connected in series; and
an antenna provided at a distance from the shunt element,
wherein the negative resistance element and the shunt element are electrically connected in parallel to the voltage bias circuit.
2. The oscillator according to claim 1, wherein a wire connecting the negative resistance element and the shunt element has a length of not more than ¼ of a wavelength of an electromagnetic wave produced by the resonator.
3. The oscillator according to claim 1, wherein the resonator and the shunt element are formed on a same chip.
4. The oscillator according to claim 1, wherein the shunt element is a first shunt element,
wherein the oscillator further comprises one or a plurality of second shunt elements,
wherein each of the one or a plurality of second shunt elements includes a capacitor, and
wherein each of the one or a plurality of second shunt elements, the negative resistance element, and the first shunt element are electrically connected in parallel to the voltage bias circuit.
5. The oscillator according to claim 4, wherein a wire connecting at least one of the one or a plurality of second shunt elements and the negative resistance element has a length of not more than ¼ of a wavelength of an electromagnetic wave produced by the resonator.
6. The oscillator according to claim 4, wherein the first shunt element and the one or a plurality of second shunt elements are each connected to the negative resistance element by a wire having a length of not more than ¼ of a wavelength corresponding to a cut-off frequency on a high frequency side.
7. The oscillator according to claim 4, wherein the first shunt element and the one or a plurality of second shunt elements each suppress oscillation of an electromagnetic wave in a higher frequency band as a wire for connection to the negative resistance element is shorter.
8. The oscillator according to claim 4, wherein the resonator and one of the one or a plurality of second shunt elements are formed on a same chip.

9. The oscillator according to claim 4, wherein the first shunt element and the one or a plurality of second shunt elements are each formed on different members.

10. The oscillator according to claim 4, wherein each of the one or a plurality of second shunt elements does not include a resistor.

11. The oscillator according to claim 1, further comprising:
a first substrate on which the voltage bias circuit is formed; and
a second substrate on which the resonator is formed,
wherein the first substrate and the second substrate are electrically connected via a cable.

12. The oscillator according to claim 1, wherein the resistor of the shunt element has a resistance value of at least ½ and not more than two times of an absolute value of an impedance of the negative resistance element in a negative resistance region, and
wherein the negative resistance region is a region where a current decreases as a voltage increases in voltage-current characteristics.

13. The oscillator according to claim 1, wherein $R/10 \geq 1/(2\pi f0 \times C)$ is satisfied, where C is a capacitance value of the capacitor of the first shunt element, R is a resistance value of the resistor of the first shunt element, and f0 is a cut-off frequency on a low frequency side of the first shunt element.

14. The oscillator according to claim 1, wherein a frequency of an electromagnetic wave produced by the resonator is at least 30 GHz and not more than 30 THz.

15. The oscillator according to claim 1, wherein the shunt element includes a capacitor in which a dielectric film is sandwiched between two electrodes.

16. An imaging device comprising:
an illumination device including the oscillator according to claim 1; and
an imaging element configured to image a subject irradiated with an electromagnetic wave produced by the oscillator.

17. An oscillator comprising:
a resonator including a negative resistance element;
a voltage bias circuit configured to apply a voltage across the negative resistance element; and
a shunt element in which a resistor and a capacitor are electrically connected in series,
wherein the negative resistance element and the shunt element are electrically connected in parallel to the voltage bias circuit, and
wherein the voltage bias circuit applies an alternating voltage across the negative resistance element.

18. An oscillator comprising:
a resonator including a negative resistance element;
a voltage bias circuit configured to apply a voltage across the negative resistance element; and
a shunt element in which a resistor and a capacitor are electrically connected in series,
wherein the negative resistance element and the first shunt element are electrically connected in parallel to the voltage bias circuit, and
wherein the capacitor is formed of a MIM (Metal-Insulator-Metal) capacitor.

19. The oscillator according to claim 18, wherein a wire connecting the negative resistance element and the shunt element has a length of not more than ¼ of a wavelength of an electromagnetic wave produced by the resonator.

20. The oscillator according to claim 18, wherein the shunt element is a first shunt element,
wherein the oscillator further comprises one or a plurality of second shunt elements,
wherein each of the one or a plurality of second shunt elements includes a capacitor, and
wherein each of the one or a plurality of second shunt elements, the negative resistance element, and the first shunt element are electrically connected in parallel to the voltage bias circuit.

* * * * *